United States Patent
Nishiyama

(10) Patent No.: US 9,389,287 B2
(45) Date of Patent: Jul. 12, 2016

(54) NUCLEAR MAGNETIC RESONANCE SPECTROMETER AND METHOD OF MAGNETIC FIELD CORRECTION

(75) Inventor: Yusuke Nishiyama, Akishima (JP)

(73) Assignee: JEOL Ltd., Tokyo (JP)

( * ) Notice: Subject to any disclaimer, the term of this patent is extended or adjusted under 35 U.S.C. 154(b) by 1089 days.

(21) Appl. No.: 13/366,699

(22) Filed: Feb. 6, 2012

(65) Prior Publication Data
US 2013/0030749 A1    Jan. 31, 2013

(30) Foreign Application Priority Data

Jul. 27, 2011    (JP) .................................. 2011-164481

(51) Int. Cl.
| | |
|---|---|
| G06F 19/00 | (2011.01) |
| G01R 33/30 | (2006.01) |
| G01R 33/24 | (2006.01) |

(52) U.S. Cl.
CPC ............ *G01R 33/307* (2013.01); *G01R 33/243* (2013.01)

(58) Field of Classification Search
CPC . G01R 33/243; G01R 33/307; G01R 33/3875
USPC ............ 324/300–322; 702/104; 600/407–435
See application file for complete search history.

(56) References Cited

U.S. PATENT DOCUMENTS

| | | | | |
|---|---|---|---|---|
| 4,899,111 | A | * | 2/1990 | Pines et al. ..................... 324/321 |
| 4,968,938 | A | * | 11/1990 | Pines et al. ..................... 324/321 |
| 4,968,939 | A | * | 11/1990 | Pines et al. ..................... 324/321 |

(Continued)

FOREIGN PATENT DOCUMENTS

JP    200952567 A    3/2009

OTHER PUBLICATIONS

Nishiyama, Yusuke, Yu Tsutsumi, and Hiroaki Utsumi. "Magic Shimming: Gradient shimming with magic angle sample spinning." Journal of Magnetic Resonance 216 (2012): 197-200.*

(Continued)

*Primary Examiner* — Melissa Koval
*Assistant Examiner* — Rishi Patel
(74) *Attorney, Agent, or Firm* — The Webb Law Firm

(57) ABSTRACT

In a nuclear magnetic resonance (NMR) spectrometer, a sample spins about an axis tilted at a magic angle, a corrective magnetic field generating portion produces a corrective magnetic field, and a control portion controls the operation of the corrective magnetic field generating portion. An arithmetic unit included in the control portion uses at least one of $B_{Z(1)}$, $B_{1(1)}{}^e$, and $B_{1(1)}{}^o$ or the linear sum of at least two of them as the first-order magnetic field component of the corrective magnetic field, uses at least one of $B_{2(2)}{}^e$, $B_{2(2)}{}^o$, $B_{2(1)}{}^e$, and $B_{2(1)}{}^o$ or the linear sum of at least two of them as the second-order magnetic field component of the corrective magnetic field, and uses at least one of $B_{Z(3)}$, $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or the linear sum of at least two of them as the third-order magnetic field component of the corrective magnetic field.

10 Claims, 10 Drawing Sheets

(56) References Cited

U.S. PATENT DOCUMENTS

| | | | |
|---|---|---|---|
| 2010/0127702 A1* | 5/2010 | Greiser | G01R 33/3875 324/309 |
| 2012/0176136 A1* | 7/2012 | Shinagawa | G01R 33/3815 324/322 |
| 2013/0030749 A1* | 1/2013 | Nishiyama | 702/104 |

OTHER PUBLICATIONS

P.C.M. Van Zijl et al, "Optimized Shimming for High-Resolutions NMR Using Three-Dimensional Image-Based Field Mapping", Journal of Magnetic Resonance, Series A, 1994, pp. 203-207, 111.

Herve Barjat et al., "A Practical Method for Automated Shimming with Normal Spectrometer Hardware", Journal of Magnetic Resonance, 1997, pp. 197-201, 125.

A. Sodickson et al., "Shimming a High-Resolution MAS Probe", Journal of Magnetic Resonance, 1997, pp. 87-91, 128.

Martial Piotto et al., "Practical aspects of shimming a high resolution magic angle spinning probe", Journal of Magnetic Resonance, 2005, pp. 84-89, 173.

Manfred G. Prammer et al., "A New Approach to Automatic Shimming", Journal of Magnetic Resonance, 1988, pp. 40-52, 77.

\* cited by examiner

| SHIM TERMS REPRESENTED BY A METHOD OF REPRESENTATION ACCORDING TO ONE EMBODIMENT OF THIS INVENTION | SHIM TERMS REPRESENTED BY OTHER METHODS OF REPRESENTATION |
|---|---|
| $B^e_{1(1)}$ | $B_{x1}$ |
| $B^o_{1(1)}$ | $B_{y1}$ |
| $B^e_{2(2)}$ | $B_{x2}$ or $B_{x2-y2}$ |
| $B^o_{2(2)}$ | $B_{y2}$ or $B_{xy}$ |
| $B^e_{2(1)}$ | $B_{zx}$ |
| $B^o_{2(1)}$ | $B_{zy}$ |
| $B^e_{3(1)}$ | $B_{z^2 x}$ |
| $B^o_{3(1)}$ | $B_{z^2 y}$ |
| $B^e_{3(2)}$ | $B_{zx2}$ or $B_{z(x^2+y^2)}$ |
| $B^o_{3(2)}$ | $B_{zy2}$ or $B_{xyz}$ |
| $B^e_{3(3)}$ | $B_{x3}$ |
| $B^o_{3(3)}$ | $B_{y3}$ |

FIG.14

NUCLEAR MAGNETIC RESONANCE SPECTROMETER AND METHOD OF MAGNETIC FIELD CORRECTION

BACKGROUND OF THE INVENTION

1. Field of the Invention

The present invention relates to a nuclear magnetic resonance spectrometer and also to a method of magnetic field correction.

2. Description of Related Art

In NMR (nuclear magnetic resonance) spectroscopy, the resonance frequency ω is in proportion to the strength $B_0$ of the static magnetic field and to the gyromagnetic ratio γ of nuclear spins, as given by $$\omega_{ideal} = \gamma B_0$$

Therefore, the positions of peaks appearing in an NMR spectrum directly reflect the strength of the static magnetic field. As a result, the distribution (lineshape) of peak positions reflects the distribution of the static magnetic field. Accordingly, in high-resolution NMR spectroscopy, there is an intrinsic requirement for high static field homogeneity. Where static magnetic field strengths are distributed spatially, if the difference with an ideal static magnetic field strength is given by δB(r), then the distribution of resonant frequencies is given by $$\omega_{unshimmed}(r) = \gamma(B_0 + \delta B(r))$$

A method of correcting a static magnetic field by electrically energizing electromagnets (known as a shim coil set) to produce a corrective magnetic field so as to correct the static magnetic field is widely accepted to achieve a uniform static magnetic field (see, for example, JP-A-8-316031). Let $\delta B_{shim}(r)$ be the strength of a magnetic field produced by a shim coil set. The resulting static magnetic field is given by $$\omega_{shimmed}(r) = \gamma(B_0 + \delta B(r) + \delta B_{shim}(r))$$

Accordingly, if the shim coil set is energized with an electrical current satisfying the relationship, $\delta B(r) + \delta B_{shim}(r) = 0$, then an ideal homogeneous magnetic field is obtained. Generally, numerous shim coils are mounted in an NMR instrument to produce various corrective magnetic fields. It is important to determine what magnitude of electrical current should be fed to what shim coil in accomplishing a homogeneous static magnetic field.

A shim coil generally used in an NMR instrument is so placed that its Z-axis lies parallel to the static magnetic field and that the strength of the produced corrective magnetic field varies according to a spherical harmonic function. This permits various terms of the corrective magnetic field components to be adjusted independently. Consequently, efficient shim adjustments can be accomplished. In particular, a corrective magnetic field applied by a shim coil in the axial direction (Z-axis direction) can be given by Eq. (1). Corrective magnetic fields applied by shim coils in radial directions (X-axis and Y-axis directions) can be given by the following Eqs. (2) and (3)z:

$$B_{z(n)} \propto b_{z(n)} r^n P_n(\cos \theta) \quad (1)$$

$$B_{m(n)}^e \propto b_{m(n)} r^n P_{nm_n}(\cos \theta) \cos m\phi \quad (2)$$

$$B_{m(n)}^o \propto b_{m(n)} r^n P_{nm_n}(\cos \theta) \sin m\phi \quad (3)$$

where n is an integer equal to or greater than unity, m is an integer satisfying the relationship |m|≤n (when n=1, m=−1, 0, 1; when n=2, m=−2, −1, 0, 1, 2), z is an axis extending along the static magnetic field, bz(n) corresponds to the magnitude of the current flowing through the shim coil, r, θ, φ are coordinate-axis components of polar coordinates, and $P_{nm_n}(\cos \theta)$ are associated Legendre functions.

If the sample is spun about the Z-axis, inhomogeneities of the magnetic field along the Z-axis (i.e., within the XY-plane) are averaged. Inhomogeneities about the Z-axis appear only as spinning sidebands. Therefore, if the spinning sidebands are neglected, field inhomogeneities can be corrected only with the terms $B_{z(n)}$ regarding the Z-axis direction. Where the sample is not spun, it is necessary to adjust all the terms $B_{z(n)}$, $B_{m(n)}^e$, and $B_{m(n)}^o$.

In NMR spectroscopy, magic angle spinning (MAS) has enjoyed wide acceptance. That is, a sample is spun about an axis tilted at magic angle $\theta_m$ from a static magnetic field. Especially, in solid-state NMR spectroscopy, MAS NMR is used as a general technique. The magic angle $\theta_m$ is given by $$\theta_m = \cos^{-1}\left(\frac{1}{\sqrt{3}}\right)$$

At this time, inhomogeneities in the magnetic field around the axis of rotation of the sample are averaged out by MAS. Usually, in MAS NMR, spinning sidebands due to field inhomogeneities present no problems because the spinning rate of the sample is sufficiently larger than field inhomogeneities along the axis of spinning of the sample. Consequently, if the field inhomogeneities in the direction of spinning of the sample are corrected, high-resolution NMR spectra are accomplished.

A method of correcting a static magnetic field, which is applied to a sample to be investigated by NMR, by the use of shim coils is now described.

In an NMR spectrum, peaks appear at various unshimmed positions ($\omega_{unshimmed}(r)$). If the static magnetic field within the sample is uniform, signals appear only in a very narrow range of frequencies. Also, the peak intensities are maximized. Accordingly, the current flowing through each shim coil is so adjusted that the intensity of a peak appearing in an NMR spectrum maximizes and that the linewidth minimizes. It is also possible to adjust the current value through the shim coil, using an NMR signal to be observed directly. Furthermore, the adjustment can be carried out using another NMR signal (e.g., in the case of solution NMR spectroscopy, a $^2$H NMR signal arising from a solvent). In cases of solid samples many of which show short transverse magnetization relaxation times, the current value of the shim coil is adjusted using a reference sample showing a long transverse magnetization relaxation time. Then, the sample is exchanged. Thereafter, an NMR measurement can be performed.

However, in the above-described method of adjusting the current in the shim coil while directly observing the NMR signal, signals appearing at various locations within a sample are summed up and detected as an NMR signal. That is, in this method, it is impossible to obtain information indicating what position within the sample is shifted by what frequency (i.e., the static magnetic field is shifted). Therefore, it is impossible to forecast what shim coil should be electrically energized in order to improve the homogeneity of the static magnetic field. Furthermore, in order to improve the homogeneity of the static magnetic field by this method, plural NMR measurements are performed, for example, while varying the current fed to the shim coil until the linewidth of the resulting NMR signal is observed to be reduced and the signal intensity is observed to be increased. In this method, however, plural NMR measurements are needed and so this method is time-consuming. Furthermore, there is another problem that different results arise when an operator having different skills manipulates the instrument. Additionally, the homogeneity is evaluated using only linewidth and intensity of an NMR signal. Consequently, the instrument's operator often falls into local solutions.

A method using gradient shimming is known as a method of correcting a static magnetic field. In the method of gradient shimming, gradient magnetic field pulses and an echo method are combined, so that the position of the sample and the strength of the static magnetic field in that position (static magnetic field map) can be detected.

In the gradient shimming method, an unshimmed static magnetic field map and static magnetic field maps obtained when shim coils are energized with electrical currents are measured. The unshimmed static magnetic field map indicates how the static magnetic field is distributed. The static magnetic field maps show how the magnetic field is distributed when what currents are fed to what shim coils. These measurements make it possible to calculate what magnitudes of currents should be fed to what shim coils to make uniform the magnetic field.

For example, in solution NMR spectroscopy, the direction of a static magnetic field is taken along the Z-axis. An elongated sample tube is so positioned that its longitudinal axis lies along the Z-axis. In solution NMR, the magnetic field distributions along the X- and Y-axes are averaged by neglecting the magnetic field distributions along the X- and Y-axes or spinning the sample about the Z-axis. Thus, the homogeneity of the static magnetic field is improved by adjusting only the shim terms $B_{z(n)}$ (see Eq. (1) above) expanded about the Z-axis by the use of gradient shimming. This method is known as one-axis gradient shimming.

However, the situation is different in MAS NMR. In solid-state NMR employing MAS, the longitudinal direction of an elongated sample tube does not lie on the Z-axis. Rather, the sample is spun about an axis ($Z^{tilt}$-axis) tilted at the angle $\theta_m$ from the Z-axis. The magnetic field distribution around the $Z^{tilt}$-axis can be averaged by sample spinning. Accordingly, the magnetic field distribution along the $Z^{tilt}$-axis may be corrected. However, the Z-axis and the $Z^{tilt}$-axis are different. Therefore, efficient magnetic field correction cannot be achieved with shim terms expanded around the Z-axis. For example, the strength of the magnetic field along the $Z^{tilt}$-axis does not vary, for example, whatever the field component $B_{z(2)}$ is varied. Accordingly, in an MAS NMR instrument, the one-axis gradient shimming which is used in the aforementioned solution NMR spectroscopy and which varies the shim terms $B_{z(n)}$ cannot be utilized in some cases.

In this way, where NMR measurements are performed while spinning the sample about an axis tilted from the direction of the static magnetic field (Z-axis direction), the static magnetic field cannot be efficiently corrected in some cases.

A completely three-dimensional magnetic field distribution map is obtained by using three-dimensional NMR imaging. Therefore, if a sample is spun about an axis tilted from the direction of the static magnetic field (in the direction of the Z-axis), the magnetic field can be corrected. For example, even in solid-state NMR spectroscopy employing MAS, the magnetic field can be corrected. However, it is necessary to obtain a three-dimensional magnetic field distribution. Hence, it is time-consuming to make measurements. Furthermore, there is the problem that the instrument is complicated because a three-dimensional gradient magnetic field pulse system is required.

SUMMARY OF THE INVENTION

In view of the foregoing problems, the present invention has been made. According to some aspects of the invention, nuclear magnetic resonance spectrometer and method of magnetic field correction capable of correcting a magnetic field efficiently can be offered.

(1) A nuclear magnetic resonance spectrometer associated with the present invention spins a sample about an axis tilted at the magic angle with respect to a static magnetic field and detects an NMR signal. The spectrometer includes a static magnetic field generating portion for producing the static magnetic field, a corrective magnetic field generating portion for producing a corrective magnetic field to correct the static magnetic field, a control portion for controlling the corrective magnetic field generating portion, and a probe for detecting the NMR signal emanating from the sample. The control portion has a magnetic field distribution acquisition section for obtaining a distribution of the static magnetic field along the tilted axis, an arithmetic unit for determining a first coefficient of a first-order magnetic field component of the corrective magnetic field along the tilted axis, a second coefficient of a second-order magnetic field component of the corrective magnetic field along the tilted axis, and a third coefficient of a third-order magnetic field component of the corrective magnetic field along the tilted axis, based on the distribution of the static magnetic field along the tilted axis, and a corrective magnetic field generating portion control section for controlling the corrective magnetic field generating portion based on the first, second, and third coefficients. The corrective magnetic field is given by the following Eqs. (1), (2), and (3). The arithmetic unit uses at least one of $B_{Z(1)}$, $B_{1(1)}{}^e$, and $B_{1(1)}{}^o$ or the linear sum of at least two of them as the first-order magnetic field component of the corrective magnetic field along the tilted axis. The arithmetic unit uses at least one of $B_{2(2)}{}^e$, $B_{2(2)}{}^o$, $B_{2(1)}{}^e$, and $B_{2(1)}{}^o$ or the linear sum of at least two of them as the second-order magnetic field component of the corrective magnetic field along the tilted axis. The arithmetic unit uses at least one of $B_{Z(3)}$, $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or the linear sum of at least two of them as the third-order magnetic field component of the corrective magnetic field along the tilted axis:

$$B_{z(n)} \propto b_{z(n)} r^n P_n(\cos \theta) \tag{1}$$

$$B_{m(n)}{}^e \propto b_{m(n)} r^n P_{nm_n}(\cos \theta) \cos m\phi \tag{2}$$

$$B_{m(n)}{}^o \propto b_{m(n)} r^n P_{nm_n}(\cos \theta) \sin m\phi \tag{3}$$

where n is an integer equal to or greater than unity, m is an integer satisfying the relationship $|m| \leq n$, z is an axis extending along the static magnetic field, $b_{m(n)}$ are said first, second, and third coefficients, r, $\theta$, $\phi$ are coordinate-axis components of polar coordinates, and $P_{nm_n}(\cos \theta)$ are associated Legendre functions.

The NMR spectrometer constructed in this way can efficiently correct the static magnetic field applied to the sample that is spun about an axis tilted at the magic angle with respect to the static magnetic field.

(2) In the NMR spectrometer associated with the present invention, the magnetic field distribution acquisition section may obtain the distribution of the static magnetic field along the tilted axis by a spin echo method or a gradient echo method.

This NMR spectrometer can easily obtain the distribution of the static magnetic field along the axis tilted at the magic angle with respect to the static magnetic field.

(3) In the NMR spectrometer associated with the present invention, the corrective magnetic field generating portion has plural coils and a power supply unit for supplying electrical currents to the coils. The corrective magnetic field generating portion control section determines the amounts of currents supplied to the coils, based on the first, second, and third coefficients determined by the arithmetic unit. The power supply unit may supply currents corresponding to the amounts of currents determined by the corrective magnetic field generating portion to the coils.

(4) A method of magnetic field correction in accordance with the present invention is implemented in a nuclear magnetic resonance measurement in which a sample is spun about an axis tilted at the magic angle with respect to a static magnetic field and the resulting NMR signal is detected. In this method, a corrective magnetic field is produced to correct the static magnetic field along the tilted axis. The method starts with acquiring a distribution of the static magnetic field along the tilted axis. Then, based on the acquired distribution of the static magnetic field along the tilted axis, a first coefficient of a first-order magnetic field component of the corrective magnetic field along the tilted axis, a second coefficient of a second-order magnetic field component of the corrective magnetic field along the tilted axis, and a third coefficient of a third-order magnetic field component of the corrective magnetic field along the tilted axis are computationally determined. Based on the first, second, and third coefficients, the corrective magnetic field is controlled. The corrective magnetic field is given by the following Eqs. (1), (2), and (3). During the step of computationally determining the coefficients, at least one of $B_{Z(1)}$, $B_{1(1)}^{e}$, and $B_{1(1)}^{o}$ or the linear sum of at least two of them is used as the first-order magnetic field component of the corrective magnetic field along the tilted axis. At least one of $B_{2(2)}^{e}$, $B_{2(2)}^{o}$, $B_{2(1)}^{e}$, and $B_{2(1)}^{o}$ or the linear sum of at least two of them is used as the second-order magnetic field component of the corrective magnetic field along the tilted axis. At least one of $B_{Z(3)}$, $B_{3(1)}^{e}$, $B_{3(1)}^{o}$, $B_{3(2)}^{e}$, $B_{3(2)}^{o}$, $B_{3(3)}^{e}$, and $B_{3(3)}^{o}$ or the linear sum of at least two of them is used as the third-order magnetic field component of the corrective magnetic field along the axis $$B_{z(n)} \propto b_{z(n)} r^n P_n(\cos \theta) \qquad (1)$$

$$B_{m(n)}^{e} \propto b_{m(n)} r^n P_{nm_n}(\cos \theta) \cos m\phi \qquad (2)$$

$$B_{m(n)}^{o} \propto b_{m(n)} r^n P_{nm_n}(\cos \theta) \sin m\phi \qquad (3)$$

where
n is an integer equal to or greater than unity,
m is an integer satisfying the relationship $|m| \leq n$,
z is an axis extending along the static magnetic field,
$b_{m(n)}$ are the first, second, and third coefficients,
r, θ, φ are coordinate-axis components of polar coordinates, and
$P_{nm_n}(\cos \theta)$ are associated Legendre functions.

In this method of magnetic field correction, the static magnetic field applied to the sample spun about the axis tilted at the magic angle with respect to the static magnetic field can be efficiently corrected.

(5) In the method of magnetic field correction associated with the present invention, during the step of acquiring the distribution of the magnetic field, the distribution of the static magnetic field along the tilted axis may be acquired by a spin echo method or a gradient echo method.

According to this method of magnetic field correction, the distribution of the static magnetic field along the axis tilted at the magic angle with respect to the static magnetic field can be easily obtained.

(6) A nuclear magnetic resonance spectrometer associated with the present invention is adapted to spin a sample about an axis tilted at an angle of π/2 with respect to a static magnetic field and to detect the resulting NMR signal. The spectrometer includes a static magnetic field generating portion for producing the static magnetic field, a corrective magnetic field generating portion for producing a corrective magnetic field to correct the static magnetic field, a control portion for controlling the corrective magnetic field generating portion, and a probe for detecting the NMR signal emanating from the sample. The control portion has a magnetic field distribution acquisition section for obtaining a distribution of the static magnetic field along the tilted axis, an arithmetic unit for computationally determining a first coefficient of a first-order magnetic field component of the corrective magnetic field along the tilted axis, a second coefficient of a second-order magnetic field component of the corrective magnetic field along the tilted axis, and a third coefficient of a third-order magnetic field component of the corrective magnetic field along the tilted axis, based on the distribution of the static magnetic field along the tilted axis, and a corrective magnetic field generating portion control section for controlling the corrective magnetic field generating portion based on the first, second, and third coefficients. The corrective magnetic field is given by the following Eqs. (1), (2), and (3). The arithmetic unit uses at least one of $B_{1(1)}^{e}$ and $B_{1(1)}^{o}$ or the linear sum of these two as the first-order magnetic field component of the corrective magnetic field along the tilted axis. The arithmetic unit uses at least one of $B_{Z(2)}$, $B_{2(2)}^{e}$, $B_{2(2)}^{o}$, $B_{2(1)}^{o}$, and $B_{2(1)}^{o}$ or the linear sum of at least two of them as the second-order magnetic field component of the corrective magnetic field along the tilted axis. The arithmetic unit uses at least one of $B_{3(1)}^{e}$, $B_{3(1)}^{o}$, $B_{3(2)}^{e}$, $B_{3(2)}^{o}$, $B_{3(3)}^{e}$, and $B_{3(3)}^{o}$ or the linear sum of at least two of them as the third-order magnetic field component of the corrective magnetic field along the tilted axis $$B_{z(n)} \propto b_{z(n)} r^n P_n(\cos \theta) \qquad (1)$$

$$B_{m(n)}^{e} \propto b_{m(n)} r^n P_{nm_n}(\cos \theta) \cos m\phi \qquad (2)$$

$$B_{m(n)}^{o} \propto b_{m(n)} r^n P_{nm_n}(\cos \theta) \sin m\phi \qquad (3)$$

where
n is an integer equal to or greater than unity,
m is an integer satisfying the relationship $|m| \leq n$,
z is an axis extending along the static magnetic field,
$b_{m(n)}$ are said first, second, and third coefficients,
r, θ, φ are coordinate-axis components of polar coordinates, and
$P_{nm_n}(\cos \theta)$ are associated Legendre functions.

The NMR spectrometer constructed in this way can efficiently correct the static magnetic field applied to the sample that is spun about the axis tilted at the angle of π/2 with respect to the static magnetic field.

(7) A method of magnetic field correction associated with the present invention is implemented in a nuclear magnetic resonance measurement in which a sample is spun about an axis tilted at an angle of π/2 with respect to a static magnetic field and the resulting NMR signal is detected. In this method, the static magnetic field along the tilted axis is corrected by producing a corrective magnetic field. The method starts with acquiring a distribution of the static magnetic field along the tilted axis. Then, based on the acquired distribution of the static magnetic field along the tilted axis, a first coefficient of a first-order magnetic field component of the corrective magnetic field along the tilted axis, a second coefficient of a second-order magnetic field component of the corrective magnetic field along the tilted axis, and a third coefficient of a third-order magnetic field component of the corrective magnetic field along the tilted axis are computationally determined. Based on the first, second, and third coefficients, the corrective magnetic field is controlled. The corrective magnetic field is given by the following Eqs. (1), (2), and (3). During the step of computationally determining the coefficients, at least one of $B_{1(1)}{}^e$ and $B_{1(1)}{}^o$ or the linear sum of these two is used as the first-order magnetic field component of the corrective magnetic field along the tilted axis. At least one of $B_{Z(2)}$, $B_{2(2)}{}^e$, $B_{2(2)}{}^o$, $B_{2(1)}{}^e$, and $B_{2(1)}{}^o$ or the linear sum of at least two of them is used as the second-order magnetic field component of the corrective magnetic field along the tilted axis. At least one of $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or the linear sum of at least two of them is used as the third-order magnetic field component of the corrective magnetic field along the tilted axis $$B_{z(n)} \propto b_{z(n)} r^n P_n(\cos\theta) \tag{1}$$

$$B_{m(n)}{}^e \propto b_{m(n)} r^n P_{nm_n}(\cos\theta)\cos m\phi \tag{2}$$

$$B_{m(n)}{}^o \propto b_{m(n)} r^n P_{nm_n}(\cos\theta)\sin m\phi \tag{3}$$

where
  n is an integer equal to or greater than unity,
  m is an integer satisfying the relationship $|m|\le n$,
  z is an axis extending along the static magnetic field,
  $b_{m(n)}$ are said first, second, and third coefficients,
  r, θ, φ are coordinate-axis components of polar coordinates, and
  $P_{nm_n}(\cos\theta)$ are associated Legendre functions.

In this method of magnetic field correction, the static magnetic field applied to the sample spun about an axis tilted at an angle of π/2 with respect to the static magnetic field can be efficiently corrected.

(8) A nuclear magnetic resonance spectrometer associated with the present invention is adapted to spin a sample about an axis tilted at a first angle with respect to a static magnetic field and to detect the resulting NMR signal. The spectrometer includes a static magnetic field generating portion for producing the static magnetic field, a corrective magnetic field generating portion for producing a corrective magnetic field to correct the static magnetic field, a control portion for controlling the corrective magnetic field generating portion, and a probe for detecting the NMR signal emanating from the sample. The control portion has a magnetic field distribution acquisition section for obtaining a distribution of the static magnetic field along the tilted axis, an arithmetic unit for computationally determining a first coefficient of a first-order magnetic field component of the corrective magnetic field along the tilted axis, a second coefficient of a second-order magnetic field component of the corrective magnetic field along the tilted axis, and a third coefficient of a third-order magnetic field component of the corrective magnetic field along the tilted axis, based on the distribution of the static magnetic field along the tilted axis, and a corrective magnetic field generating portion control section for controlling the corrective magnetic field generating portion based on the first, second, and third coefficients. The first angle, β, satisfies the relationship, 5 $\cos^2\beta - 3 = 0$. The corrective magnetic field is given by the following Eqs. (1), (2), and (3). The arithmetic unit uses at least one of $B_{Z(1)}$, $B_{1(1)}{}^e$, and $B_{1(1)}{}^o$ or the linear sum of at least two of them as the first-order magnetic field component of the corrective magnetic field along the tilted axis. The arithmetic unit uses at least one of $B_{Z(2)}$, $B_{2(2)}{}^e$, $B_{2(2)}{}^o$, $B_{2(1)}{}^e$, and $B_{2(1)}{}^o$ or the linear sum of at least two of them as the second-order magnetic field component of the corrective magnetic field along the tilted axis. The arithmetic unit uses at least one of $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or the linear sum of at least two of them as the third-order magnetic field component of the corrective magnetic field along the tilted axis $$B_{z(n)} \propto b_{z(n)} r^n P_n(\cos\theta) \tag{1}$$

$$B_{m(n)}{}^e \propto b_{m(n)} r^n P_{nm_n}(\cos\theta)\cos m\phi \tag{2}$$

$$B_{m(n)}{}^o \propto b_{m(n)} r^n P_{nm_n}(\cos\theta)\sin m\phi \tag{3}$$

where
  n is an integer equal to or greater than unity,
  m is an integer satisfying the relationship $|m|\le n$,
  z is an axis extending along the static magnetic field,
  $b_{m(n)}$ are said first, second, and third coefficients,
  r, θ, φ are coordinate-axis components of polar coordinates, and
  $P_{nm_n}(\cos\theta)$ are associated Legendre functions.

According to this NMR spectrometer, the static magnetic field applied to the sample spun about the axis tilted at the first angle with respect to the static magnetic field can be efficiently corrected.

(9) A method of magnetic field correction associated with the present invention is implemented in a nuclear magnetic resonance measurement in which a sample is spun about an axis tilted at a first angle with respect to a static magnetic field and the resulting nuclear magnetic resonance signal is detected. The method is adapted to correct the static magnetic field along the tilted axis by producing a corrective magnetic field. The method starts with acquiring a distribution of the static magnetic field along the tilted axis. Then, based on the acquired distribution of the static magnetic field along the tilted axis, a first coefficient of a first-order magnetic field component of the corrective magnetic field along the tilted axis, a second coefficient of a second-order magnetic field component of the corrective magnetic field along the tilted axis, and a third coefficient of a third-order magnetic field component of the corrective magnetic field along the tilted axis are computationally determined. Based on the first, second, and third coefficients, the corrective magnetic field is controlled. The first angle, β, satisfies the relationship, 5 $\cos^2\beta - 3 = 0$. The corrective magnetic field is given by the following Eqs. (1), (2), and (3). During the step of computationally determining the coefficients, at least one of $B_{Z(1)}$, $B_{1(1)}{}^e$, and $B_{1(1)}{}^o$ or the linear sum of at least two of them is used as the first-order magnetic field component of the corrective magnetic field along the tilted axis. At least one of $B_{Z(2)}$, $B_{2(2)}{}^e$, $B_{2(2)}{}^o$, $B_{2(1)}{}^e$, and $B_{2(1)}{}^o$ or the linear sum of at least two of them is used as the second-order magnetic field component of the corrective magnetic field along the tilted axis. At least one of $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or the linear sum of at least two of them is used as the third-order magnetic field component of the corrective magnetic field along the tilted axis $$B_{z(n)} \propto b_{z(n)} r^n P_n(\cos\theta) \tag{1}$$

$$B_{m(n)}{}^e \propto b_{m(n)} r^n P_{nm_n}(\cos\theta)\cos m\phi \tag{2}$$

$$B_{m(n)}{}^o \propto b_{m(n)} r^n P_{nm_n}(\cos\theta)\sin m\phi \tag{3}$$

where
n is an integer equal to or greater than unity,
m is an integer satisfying the relationship $|m| \leq n$,
z is an axis extending along the static magnetic field,
$b_{m(n)}$ are said first, second, and third coefficients,
r, θ, φ are coordinate-axis components of polar coordinates, and
$P_{nm_n}(\cos \theta)$ are associated Legendre functions.

According to this NMR spectrometer, the static magnetic field applied to the sample that is spun about the axis tilted at the first angle with respect to the static magnetic field can be efficiently corrected.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 14 is a table showing the corresponding relationships between shim terms represented by a method of representation according to one embodiment of the invention and shim terms represented by other methods of representation.

DESCRIPTION OF THE PREFERRED EMBODIMENTS

The preferred embodiments of the present invention are hereinafter described in detail with reference to the drawings. It is to be understood that the embodiments described below do not unduly restrict the contents of the present invention delineated by the appended claims and that all the configurations described below are not always essential constituent components of the invention.

1. Configuration Of Nuclear Magnetic Resonance Spectrometer

Figure 1:
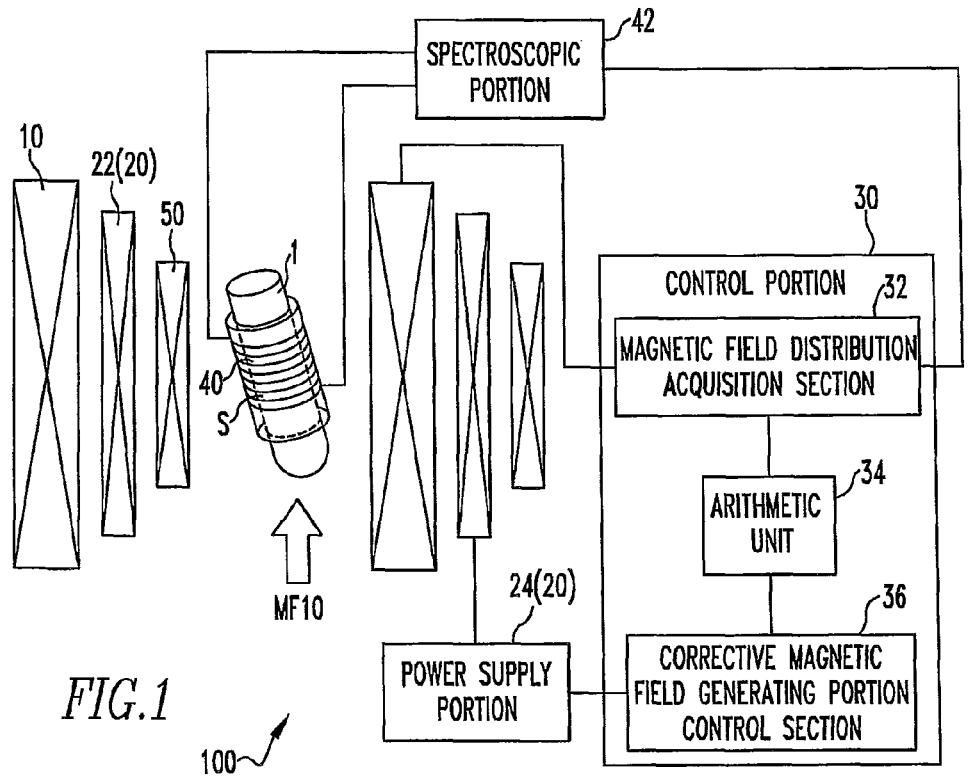
FIG. 1 is a schematic block diagram of a nuclear magnetic resonance (NMR) spectrometer associated with an embodiment of the present invention.
Figure 2:
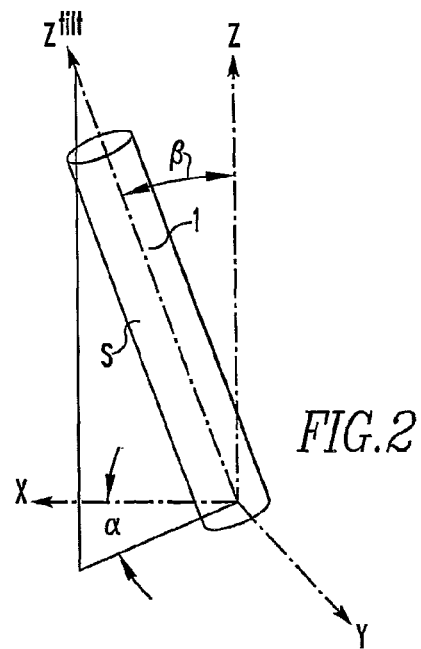
FIG. 2 is a schematic perspective view of a sample tube inserted in the NMR spectrometer shown in FIG. 1.

The configuration of a nuclear magnetic resonance (NMR) spectrometer associated with an embodiment of the present invention is first described. FIG. 1 is a schematic block diagram showing the NMR spectrometer, 100, associated with the present embodiment. FIG. 2 is a schematic perspective view of a sample tube 1 inserted in the NMR spectrometer 100.

The NMR spectrometer 100 spins a sample S about a $Z^{tilt}$-axis tilted at magic angle $\theta_m$ with respect to a static magnetic field (Z-axis direction) and detects the resulting NMR signal as shown in FIG. 2. As shown in FIG. 1, the NMR spectrometer 100 includes a static magnetic field generating portion 10, a corrective magnetic field generating portion 20, a control portion 30 for controlling the operation of the corrective magnetic field generating portion 20, and a probe 40.

The sample S is put in the elongated sample tube 1, which in turn is inserted in the NMR spectrometer 100 such that the longitudinal direction of the tube 1 is along the $Z^{tilt}$-axis tilted at the magic angle $\theta_m$ with respect to the Z-axis as shown in FIG. 2. That is, the angle β made between the Z-axis shown in FIG. 2 and the $Z^{tilt}$-axis is equal to the magic angle ($\beta = \theta_m$). The instrument 100 spins the sample S in the sample tube 1 about the $Z^{tilt}$-axis tilted at, or substantially at, the magic angle $\theta_m$ with respect to a static magnetic field MF10 (i.e., along the Z-axis). That is, the sample tube 1 holding the sample S therein rotates about the $Z^{tilt}$-axis. The $Z^{tilt}$-axis is tilted at an angle, for example, in the range $\theta_m - 5° \leq \beta \leq \theta_m + 5°$ with respect to the static magnetic field. The static magnetic field MF10 is applied to the sample S in the sample tube 1 by the static magnetic field generating portion 10. A corrective magnetic field is applied by the corrective magnetic field generating portion 20.

The sample tube 1 is inserted, for example, in a stator tube (not shown) provided with gas supply holes. The tube 1 is held at the magic angle $\theta_m$ by high-pressure gas supplied through the gas supply holes. A turbine (not shown) is formed in the top portion of the sample tube 1. Gas blowout ports are formed in the stator tube to permit rotation of the turbine. The sample tube 1 is spun by supplying the high-pressure gas from the gas blowout holes.

The static magnetic field generating portion 10 produces the static magnetic field MF10 that lies along the Z-axis shown in FIG. 2. For example, the static magnetic field generating portion 10 is a superconducting magnet having superconducting solenoid coils.

The corrective magnetic field generating portion 20 produces a corrective magnetic field for correcting the static magnetic field MF10 such that the magnetic field applied to the sample S in the sample tube 1 is made more uniform, for example, than where only the static field MF10 is applied. The corrective magnetic field generating portion 20 is configured including a shim coil set 22 consisting of plural coils and a power supply portion 24 for supplying electrical currents to the coils.

The shim coil set 22 is, for example, made up of plural solenoid coils. The power supply portion 24 supplies currents corresponding to amounts of currents determined by a corrective magnetic field generating portion control section 36 to the solenoid coils.

The strength of the corrective magnetic field applied by the corrective magnetic field generating portion 20 varies according to a spherical harmonic function. Specifically, the component of the corrective magnetic field along the Z-axis (in the Z-axis direction) applied by the corrective magnetic field generating portion 20 can be represented by the following Eq.

(1). The radial (X-axis and Y-axis directions) components of the corrective magnetic field applied by the corrective magnetic field generating portion 20 can be represented by the following Eqs. (2) and (3)

$$B_{z(n)} \propto b_{z(n)} r^n P_n(\cos \theta) \quad (1)$$

$$B_{m(n)}{}^e \propto b_{m(n)} r^n P_{nm_n}(\cos \theta) \cos m\phi \quad (2)$$

$$B_{m(n)}{}^o \propto b_{m(n)} r^n P_{nm_n}(\cos \theta) \sin m\phi \quad (3)$$

where
n is an integer equal to or greater than unity,
m is an integer satisfying the relationship $|m| \leq n$,
z is an axis extending along the static magnetic field,
$b_{m(n)}$ are said first, second, and third coefficients,
r, θ, φ are coordinate-axis components of polar coordinates, and
$P_{nm_n}(\cos \theta)$ are associated Legendre functions.

The control portion 30 controls the operation of the corrective magnetic field generating portion 20, and has a magnetic field distribution acquisition section 32, an arithmetic unit 34, and the aforementioned corrective magnetic field generating portion control section 36.

The magnetic field distribution acquisition section 32 acquires a distribution of the static magnetic field MF10 along the $Z^{tilt}$-axis. The magnetic field distribution acquisition section 32 can control a gradient magnetic field generating portion 50 such that gradient magnetic field pulses can be produced. The acquisition section 32 obtains a distribution of the static magnetic field along the $Z^{tilt}$-axis, using the gradient magnetic field pulses. This is a gradient echo method. The magnetic field distribution acquisition section 32 may control the corrective magnetic field generating portion 20 to produce the gradient magnetic field pulses in an unillustrated manner.

The arithmetic unit 34 computationally determines a first coefficient of the first-order magnetic field component of the corrective magnetic field along the $Z^{tilt}$-axis, a second coefficient of the second-order magnetic field component of the corrective magnetic field along the $Z^{tilt}$-axis, and a third coefficient of the third-order magnetic field component of the corrective magnetic field along the $Z^{tilt}$-axis, based on the distribution of the static magnetic field MF10 along the $Z^{tilt}$-axis obtained by the magnetic field distribution acquisition section 32. More specifically, the arithmetic unit 34 determines the coefficients of the magnetic field components of the corrective magnetic field such that the corrected magnetic field (the static magnetic field MF10 plus the corrective magnetic field) applied to the sample S becomes more uniform than when the corrections are not yet made, i.e., only the static magnetic field MF10 is applied to the sample S.

The arithmetic unit 34 uses at least one of $B_{Z(1)}$, $B_{1(1)}{}^e$, and $B_{1(1)}{}^o$ or the linear sum of at least two of them as the first-order magnetic field component of the corrective magnetic field along the $Z^{tilt}$-axis. The arithmetic unit uses at least one of $B_{2(2)}{}^e$, $B_{2(2)}{}^o$, $B_{2(1)}{}^e$, and $B_{2(1)}{}^o$ or the linear sum of at least two of them as the second-order magnetic field component of the corrective magnetic field along the $Z^{tilt}$-axis. The arithmetic unit uses at least one of $B_{Z(3)}$, $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or the linear sum of at least two of them as the third-order magnetic field component of the corrective magnetic field along the $Z^{tilt}$-axis.

The first, second, and third coefficients are $b_{Z(n)}$ in Eq. (1) and $b_{m(n)}$ in Eqs. (2) and (3). The first, second, and third coefficients correspond to the amounts of currents flowing through the shim coil set 22.

The corrective magnetic field generating portion control section 36 controls the corrective magnetic field generating portion 20, based on the first, second, and third coefficients. The control section 36 determines the amounts of currents supplied to the coils of the shim coil set 22, based on the first, second, and third coefficients determined by the arithmetic unit 34. The control section 36 outputs information about the amounts of currents to the power supply portion 24. The power supply portion 24 supplies currents indicated by the information about the amounts of currents to the coils, thus producing a corrective magnetic field.

The probe 40 detects the NMR signal emanating from the sample S. In particular, the probe 40 irradiates nuclei under observation within the sample S placed in the magnetic field with an RF magnetic field (RF pulses) and detects the NMR signal radiated from the nuclei under observation. A spectroscopic portion 42 receives the NMR signal detected by the probe 40 and creates an NMR spectrum based on the NMR signal.

2. Method Of Magnetic Field Correction

A method of magnetic field correction associated with an embodiment of the present invention is next described.

In the NMR spectrometer 100, a distribution of the static magnetic field MF10 along the $Z^{tilt}$-axis within the sample S placed in the sample tube 1 is obtained using gradient magnetic field pulses, and the corrective magnetic field is set according to the distribution. The spectrometer corrects the static magnetic field MF10 by applying the corrective magnetic field and homogenizes the magnetic field applied to the sample S.

Figure 3:
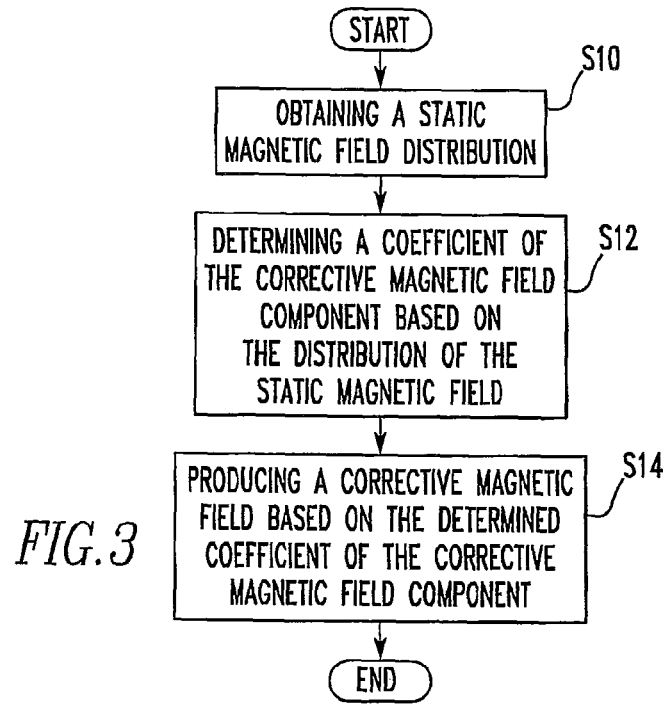
FIG. 3 is a flowchart illustrating one example of method of magnetic field correction associated with one embodiment of the invention.

FIG. 3 is a flowchart illustrating one example of the method of magnetic field correction associated with the present embodiment. The method is next described by referring to FIGS. 1 and 2 showing the NMR spectrometer 100 and to the flowchart of FIG. 3.

(1) First, a distribution of the static magnetic field MF10 along the $Z^{tilt}$-axis is obtained by the magnetic field distribution acquisition section 32 (step S10 for obtaining a magnetic field distribution).

In particular, the magnetic field distribution acquisition section 32 acquires the distribution of the static magnetic field MF10 along the $Z^{tilt}$-axis (hereinafter may also be referred to as a map of the static magnetic field distribution) by combining gradient magnetic field pulses and echoes. The present step is performed while no corrective magnetic field is applied, i.e., only the static magnetic field MF10 is applied.

The method of acquiring a distribution of the static magnetic field by the magnetic field distribution acquisition section 32 is hereinafter described.

Figure 4:
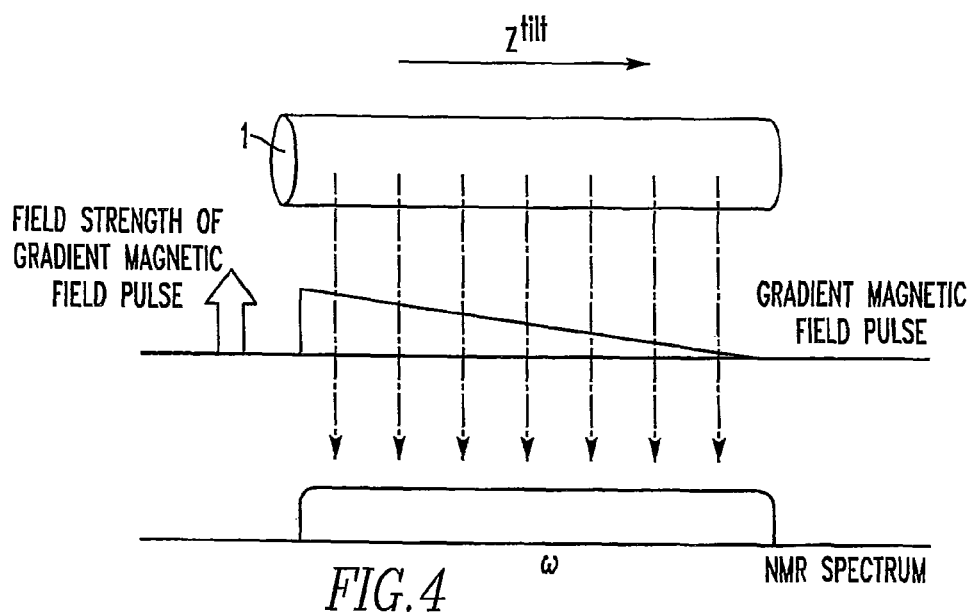
FIG. 4 is a diagram illustrating gradient magnetic field pulses.

FIG. 4 is a diagram illustrating gradient magnetic field pulses.

The gradient magnetic pulses are used to separate and observe signals at each sample position. A different magnetic field strength is given according to a different sample position by the gradient magnetic field pulses. Each gradient magnetic field pulse has a magnetic field strength that varies linearly along the Z-axis. When the position on the Z-axis remains the same, the magnetic field produced by the gradient magnetic field pulse does not vary if going along the X-axis or Y-axis. Consequently, NMR signals can be discriminated according to the Z-coordinate. The relationship, $B_{Z(1)}{}^{tilt} = B_{Z(1)} \cos \beta$, holds. The magnetic field strength of the gradient magnetic field pulses varies linearly also along the $Z^{tilt}$-axis. That is, gradient magnetic field pulses permit NMR signals to be discriminated according to coordinates taken on the $Z^{tilt}$-axis. A magnetic field imparted at a position $Z^{tilt}$ in the sample tube 1 can be represented as follows:

$$B^{PFG}(z^{tilt}) = Gz^{tilt} \cos \beta$$

where G is the magnitude of the gradient magnetic field pulse. The resonance frequency is varied by the gradient magnetic field pulse as given by $$\delta\omega^{PFG}(z^{tilt}) = \beta B^{PFG}(z^{tilt}) = \gamma G z^{tilt} \cos\beta$$

As can be seen from this equation, the resonance frequency ω and the position $Z^{tilt}$ can be directly correlated to each other as shown in FIG. 4.

A method of obtaining a distribution of the static magnetic field MF10 (also referred to as the map of the static magnetic field distribution) by combining gradient magnetic field pulses and echoes is next described.

The map of the static magnetic field distribution is measured by an echo experiment. One example of the echo experiment is a spin echo method. Another example is a gradient echo method. In any method, gradient magnetic field pulses and RF pulses are combined.

Figure 5:
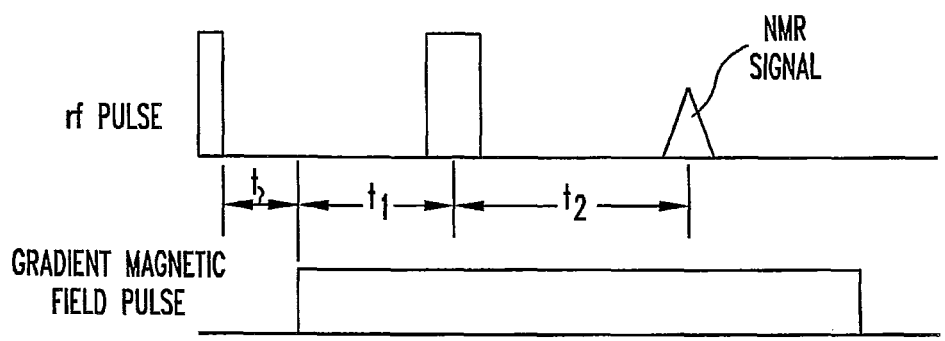
FIG. 5 is a diagram illustrating a spin echo method.
Figure 6:
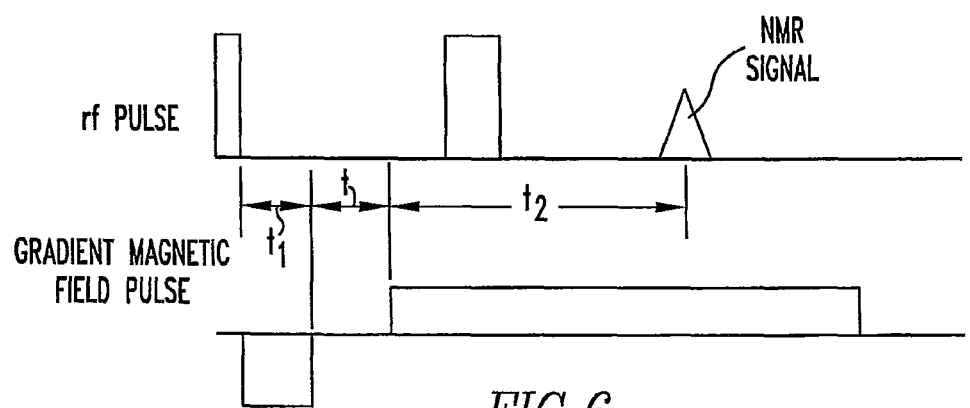
FIG. 6 is a diagram illustrating a gradient echo method.

FIG. 5 is a diagram illustrating a spin echo method. FIG. 6 is a diagram illustrating a gradient echo method.

In the spin echo method, a 90° pulse is first applied to the sample S as shown in FIG. 5. After a period of τ+$τ_1$ since the application of the 90° pulse, a 180° pulse is applied. A gradient magnetic field pulse is applied after τ since the application of the 90° pulse. An NMR signal is detected after a period of $τ_2$ since the application of the 180° pulse.

In the gradient echo method, a 90° pulse is first applied to the sample S as shown in FIG. 6. Immediately thereafter, a first gradient magnetic field pulse is applied. After a period of τ since the application of the first gradient pulse, a second gradient magnetic field pulse that is reverse in magnetic field gradient to the first gradient magnetic field pulse is applied. After a period of $τ_2$ since the application of the second gradient magnetic field pulse, an NMR signal is detected.

The 90° pulse and the 180° pulse are applied to the sample S by the probe 40. The gradient magnetic field pulses are applied to the sample S by the gradient magnetic field generating portion 50. The magnetic field distribution acquisition section 32 controls the probe 40 and the gradient magnetic field generating portion 50 such that these pulses are applied to the sample S. The NMR signal is detected by the probe 40 and input to the magnetic field distribution acquisition section 32 via the spectroscopic portion 42.

In any of the spin echo method and gradient echo method, two measurements are performed respectively under conditions τ=$τ_0$ and τ=$τ_0$+T. Let $I_0(ω)$ be an NMR signal produced when τ=$τ_0$. Let $I_T(ω)$ be an NMR signal produced when τ=$τ_0$+T. The phase difference between these two measurements can be obtained by dividing $I_T(ω)$ by $I_0(ω)$. That is, $$\phi(\omega) = arg(I_T(\omega)/I_0(\omega))$$

This phase difference has the following relationship:

$$\phi(\omega) = \gamma B(r)T$$

where B(r) is a magnetic field felt by a nuclear spin that lies at a position r during the interval τ. Accordingly, the field B(r) satisfies the following equation:

$$B(r) = \frac{1}{\gamma T} \arg(I_T(\omega)/I_0(\omega)) \tag{4}$$

As given by Eq. (4), information about local magnetic fields can be obtained from the phase difference. In this way, because of the gradient magnetic field pulses, the resonance frequency ω is directly associated with the position r. That is, the position r is obtained from the position of the resonance frequency of $I_0(ω)$ (or $I_T(ω)$). The magnetic field intensity B (r) at that location during the interval τ is obtained from Eq. (4).

In this way, the magnetic field distribution acquisition section 32 can obtain a distribution of the static magnetic field MF10 along the $Z^{tilt}$-axis prior to application of a corrective magnetic field.

In the same way as in the case of the static magnetic field MF10, the magnetic field distribution acquisition section 32 obtains a distribution of a magnetic field along the $Z^{tilt}$-axis about each of terms ($B_{Z(1)}$, $B_{1(1)}^e$, $B_{1(1)}^o$, $B_{2(2)}^e$, $B_{2(2)}^o$, $B_{2(1)}^e$, $B_{2(1)}^o$, $B_{Z(3)}$, $B_{3(1)}^e$, $B_{3(1)}^o$, $B_{3(2)}^e$, $B_{3(2)}^o$, $B_{3(3)}^e$, and $B_{3(3)}^o$) of the magnetic field components of the corrective magnetic field, using a spin echo method or a gradient echo method. For example, the magnetic field distribution acquisition section 32 acquires a distribution of a magnetic field about each term by electrically energizing only those of the coils of the shim coil set 22 which correspond to that term of the magnetic field components of the corrective magnetic field and obtaining a distribution of the magnetic field along the $Z^{tilt}$-axis using a spin echo method or a gradient echo method.

The distributions of the magnetic fields about the terms ($B_{Z(1)}$, $B_{1(1)}^e$, $B_{1(1)}^o$, $B_{2(2)}^e$, $B_{2(2)}^o$, $B_{2(1)}^e$, $B_{2(1)}^o$, $B_{Z(3)}$, $B_{3(1)}^e$, $B_{3(1)}^o$, $B_{3(2)}^e$, $B_{3(2)}^o$, $B_{3(3)}^e$, and $B_{3(3)}^o$) of the corrective magnetic field may be previously obtained by the arithmetic unit 34.

(2) Then, the arithmetic unit 34 computationally determines a first coefficient of the first-order magnetic field component of the corrective magnetic field along the $Z^{tilt}$-axis, a second coefficient of the second-order magnetic field component of the corrective magnetic field along the $Z^{tilt}$-axis, and a third coefficient of the third-order magnetic field component of the corrective magnetic field along the $Z^{tilt}$-axis based on the distribution of the static magnetic field MF10 along the $Z^{tilt}$-axis obtained by the magnetic field distribution acquisition section 32 (step S12 for calculations).

The magnetic field components of the corrective magnetic field produced by the corrective magnetic field generating portion 20 are next described.

As described previously, the NMR spectrometer 100 is an MAS NMR instrument equipped with the shim coil set 22 (see Eqs. (1), (2), and (3)) expanded about the Z-axis. The sample tube 1 is spun about the axis of spinning ($Z^{tilt}$-axis) tilted at angle β from the static magnetic field as shown in FIG. 2.

A tilted coordinate system held to the axis of spinning of the sample is now defined. The Z-axis shown in FIG. 2 is the direction of the static magnetic field and is the axis of expansion of the corrective magnetic field. The $Z^{tilt}$-axis is tilted at the angle β from the Z-axis and parallel to the axis of spinning of the sample. The angle α is made between the projection of the $Z^{tilt}$-axis onto the XY-plane and the X-axis.

Inhomogeneities of the magnetic field about the $Z^{tilt}$-axis (in a direction perpendicular to the $Z^{tilt}$-axis) are averaged by sample spinning. Therefore, in the tilted coordinate system, the distribution of the magnetic field within the sample tube 1 can be represented by only a variable on the $Z^{tilt}$-axis and represented as $B_Z^{tilt}$.

Gradient magnetic field pulses are similarly averaged by sample spinning. As described previously, a variation in the resonance frequency caused by the gradient magnetic pulses is given by $$\delta\omega^{PFG}(z^{tilt}) = \gamma B^{PFG}(z^{tilt}) = \gamma G z^{tilt} \cos\beta$$

The angle β is made between the axis of expansion (Z-axis) of the corrective magnetic field and the $Z^{tilt}$-axis. The corrective magnetic field expanded in the Z-axis direction is again expanded about the $Z^{tilt}$-axis. In particular, this is given by $$B_{z(0)}^{tilt} = B_{z(0)} \quad (5)$$

$$B_{z(1)}^{tilt} = B_{z(1)}\cos\beta + B_{1(1)}^{e}\sin\beta\cos\alpha + B_{1(1)}^{o}\sin\beta\sin\alpha$$

$$B_{z(2)}^{tilt} = 2B_{z(2)}P_2(\cos\beta) + (B_{2(2)}^{e}\cos2\alpha + B_{2(2)}^{o}\sin2\alpha)\frac{1}{2}\sin^2\beta +$$

$$(B_{2(1)}^{e}\cos\alpha + B_{2(1)}^{o}\sin\alpha)2\sin\beta\cos\beta$$

$$B_{z(3)}^{tilt} = B_{z3}\cos\beta(5\cos^2\beta - 3) + (B_{3(1)}^{e}\cos\alpha + B_{3(1)}^{o}\sin\alpha)2\sin$$

$$\beta\left(1 - \frac{5}{4}\sin^2\beta\right) + \left(B_{3(2)}^{e}\cos2\alpha + \frac{1}{2}B_{3(2)}^{o}\sin2\alpha\right)\frac{1}{2}\sin^2\beta\cos\beta +$$

$$(B_{3(3)}^{e}\cos3\alpha + B_{3(3)}^{o}\sin3\alpha)\frac{1}{12}\sin^3\beta$$

In Eq. (5) above, when β is the magic angle ($3\cos^2\beta - 1 = 0$), Eq. (5) is rewritten into the form:

$$B_{z(0)}^{tilt} = B_{z(0)}$$

$$B_{z(1)}^{tilt} = B_{z(1)}\frac{1}{\sqrt{3}} + \sqrt{\frac{2}{3}}(B_{1(1)}^{e}\cos\alpha + B_{1(1)}^{o}\sin\alpha)$$

$$B_{z(2)}^{tilt} =$$

$$2B_{z(2)} \cdot 0 + (B_{2(2)}^{e}\cos2\alpha + B_{2(2)}^{o}\sin2\alpha)\frac{1}{3} + (B_{2(1)}^{e}\cos\alpha + B_{2(1)}^{o}\sin\alpha)\frac{2\sqrt{2}}{3}$$

$$B_{z(3)}^{tilt} = -B_{z3}\frac{4}{3\sqrt{3}} + (B_{3(1)}^{e}\cos\alpha + B_{3(1)}^{o}\sin\alpha)\frac{1}{3}\sqrt{\frac{2}{3}} +$$

$$\left(B_{3(2)}^{e}\cos2\alpha + \frac{1}{2}B_{3(2)}^{o}\sin2\alpha\right)\frac{1}{3\sqrt{3}} + (B_{3(3)}^{e}\cos3\alpha + B_{3(3)}^{o}\sin3\alpha)\frac{1}{18}\sqrt{\frac{2}{3}}$$

The first-order magnetic field component $B_{z(1)}^{tilt}$ of the corrective magnetic field along the $Z^{tilt}$-axis is represented as the linear sum of the three terms, $B_{z(1)}$, $B_{2(1)}^{e}$, and $B_{2(1)}^{o}$, as given by the above formula. Accordingly, the arithmetic unit 34 can use at least one of the three terms, $B_{z(1)}$, $B_{1(1)}^{e}$, and $B_{1(1)}^{o}$, or the linear sum of at least two of them as the first-order magnetic field component $B_{z(1)}^{tilt}$ of the corrective magnetic field along the $Z^{tilt}$-axis.

The second-order magnetic field component $B_{z(2)}^{tilt}$ of the corrective magnetic field along the $Z^{tilt}$-axis is represented as the linear sum of five terms, $B_{z(2)}$, $B_{2(2)}^{e}$, $B_{2(2)}^{o}$, $B_{2(1)}^{e}$, and $B_{2(1)}^{o}$, as given by Eq. (5). However, with respect to $B_{z(2)}^{tilt}$, when $\beta=\theta_m$, the coefficient $B_{z(2)}$ is null as given by the above formula. For this reason, $B_{z(2)}$ does not affect $B_{z(2)}^{tilt}$. That is, if the term of $B_{z(2)}$ is used, the magnetic field along the $Z^{tilt}$-axis does not vary. Accordingly, the arithmetic unit 34 uses the other terms, i.e., $B_{2(2)}^{e}$, $B_{2(2)}^{o}$, $B_{2(1)}^{e}$, and $B_{2(1)}^{o}$ without using the term of $B_{z(2)}$. That is, the arithmetic unit 34 can use at least one of $B_{2(2)}^{e}$, $B_{2(2)}^{o}$, $B_{2(1)}^{e}$, and $B_{z(2)}^{tilt}$ or the linear sum of at least two of them as the second-order magnetic field component $B_{z(2)}^{tilt}$ of the corrective magnetic field along the $Z^{tilt}$-axis.

The third-order magnetic field component $B_{z(3)}^{tilt}$ of the corrective magnetic field along the $Z^{tilt}$-axis is represented as the linear sum of seven terms, $B_{z(3)}$, $B_{3(3)}^{e}$, $B_{3(3)}^{o}$, $B_{3(2)}^{e}$, $B_{3(2)}^{o}$, $B_{3(1)}^{e}$, and $B_{3(1)}^{o}$, as given by the above formula. Therefore, the arithmetic unit 34 can use at least one of $B_{z(3)}$, $B_{3(1)}^{e}$, $B_{3(1)}^{o}$, $B_{3(2)}^{e}$, $B_{3(2)}^{o}$, $B_{3(3)}^{e}$, and $B_{3(3)}^{o}$ or the linear sum of at least two of them as the third-order magnetic field component $B_{z(3)}^{tilt}$ of the corrective magnetic field along the $Z^{tilt}$-axis.

A method of determining the first, second, and third coefficients of the magnetic field components of the corrective magnetic field is next described.

Figure 7:
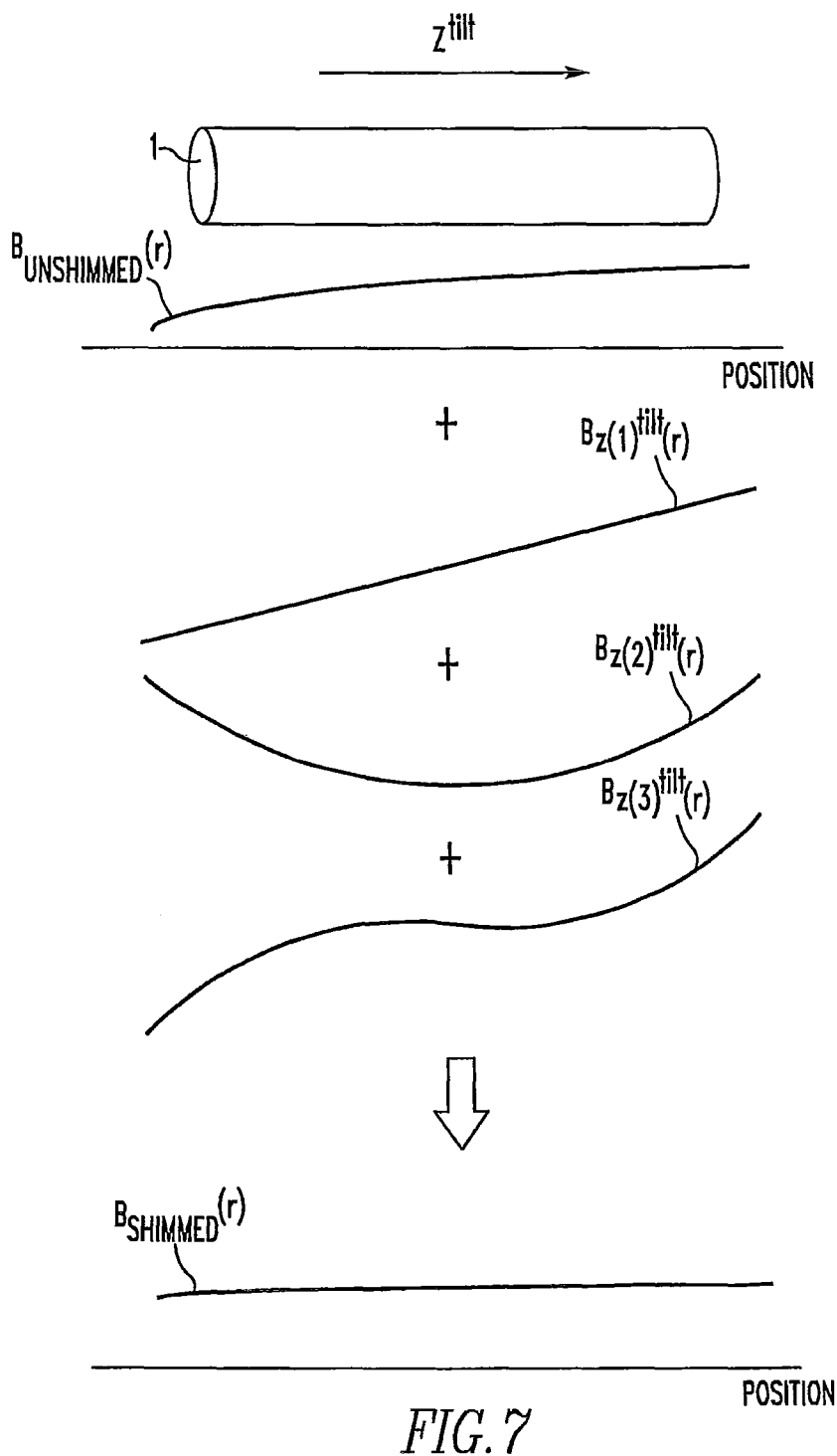
FIG. 7 is a diagram illustrating a method of determining coefficients of magnetic field components of a corrective magnetic field.

FIG. 7 is a diagram illustrating a method of determining coefficients of magnetic field components of the corrective magnetic field. The first, second, and third coefficients of the magnetic field components are so adjusted that if the unshimmed static magnetic field $B_{unshimmed}$ (static magnetic field prior to application of the corrective magnetic field), the first-order magnetic field component $B_{Z(1)}^{tilt}$ of the corrective magnetic field, the second-order magnetic field component $B_{Z(2)}^{tilt}$ of the corrective magnetic field, and the third-order magnetic field component $B_{Z(3)}^{tilt}$ of the corrective magnetic field are summed up, then the magnetic field applied to the sample S in the sample tube 1 is homogenized as shown in FIG. 7. That is, the arithmetic unit 34 determines the coefficients of the magnetic field components such that the magnetic field applied to the sample S is made more uniform by applying the corrective magnetic field, for example, than the case where only the static magnetic field MF10 is applied to the sample S. In this way, the first, second, and third coefficients are determined.

(3) Then, the corrective magnetic field generating portion control section 36 controls the corrective magnetic field generating portion 20 based on the first, second, and third coefficients such that a corrective magnetic field is produced (step S14 for producing a corrective magnetic field).

The corrective magnetic field generating portion control section 36 determines the amounts of currents fed to the coils of the shim coil set 22 according to the coefficients and outputs information about the amounts of the currents to the individual coils. The information about the amounts of currents is input to the power supply portion 24. The power supply portion 24 supplies the currents indicated by the information to the coils. Consequently, the shim coil set 22 produces the corrective magnetic field.

The static magnetic field MF10 can be corrected by generating the corrective magnetic field using the steps described so far. Consequently, the magnetic field applied to the sample S can be homogenized.

According to the present embodiment, at least one of $B_{Z(1)}$, $B_{1(1)}^{e}$, and $B_{1(1)}^{o}$ or the linear sum of at least two of them is used as the first-order magnetic field component of the corrective magnetic field along the $Z^{tilt}$-axis. At least one of $B_{2(2)}^{e}$, $B_{2(2)}^{o}$, $B_{2(1)}^{e}$, and $B_{2(1)}^{o}$ or the linear sum of at least two of them is used as the second-order magnetic field component of the corrective magnetic field along the $Z^{tilt}$-axis. At least one of $B_{Z(3)}$, $B_{3(1)}^{e}$, $B_{3(1)}^{o}$, $B_{3(2)}^{e}$, $B_{3(2)}^{o}$, $B_{3(3)}^{e}$, and $B_{3(3)}^{o}$ or the linear sum of at least two of them is used as the third-order magnetic field component of the corrective magnetic field along the $Z^{tilt}$-axis. The first, second, and third coefficients of the magnetic field components are determined. Based on the coefficients, the corrective magnetic field is controlled. Consequently, the static magnetic field applied to the sample S in the sample tube 1, which is spun about the axis tilted at the magic angle $\theta_m$ with respect to the static magnetic field MF10, can be corrected efficiently as described previously. That is, the corrective magnetic field can be produced with small amounts of shim currents supplied to the shim coil set 22. Accordingly, for example, even where the sample S is spun about the $Z^{tilt}$-axis tilted at the magic angle with respect to the static magnetic field (Z-axis direction) and the resulting NMR signal is detected, a homogenized magnetic field can be efficiently applied to the sample S in the sample tube 1.

For example, where the axis of spinning of the sample is coincident with the axis of expansion of the corrective magnetic field, corrective magnetic field components $B_{Z(n)}$ expanded about the Z-axis are used. However, where NMR measurements are made using magic angle spinning, the axis of spinning of the sample ($Z^{tilt}$-axis) is different from the axis of expansion (Z-axis) of the corrective magnetic field and so it is impossible to efficiently correct the static magnetic field using the corrective magnetic field components $B_{Z(n)}$ expanded about the Z-axis. For example, to whatever extent the field component $B_{Z(2)}$ may be varied, the variation in the strength of the magnetic field in the direction of the axis of spinning of the sample (along the $Z^{tilt}$-axis) remains small or null. Therefore, there is the problem that the magnetic field along the axis of spinning of the sample (along the $Z^{tilt}$-axis) cannot be corrected efficiently. In the present embodiment, this problem does not occur because the above-described magnetic field components of the corrective magnetic field are used. In consequence, the static magnetic field applied to the sample S can be efficiently corrected.

The NMR spectrometer 100 of the present embodiment enables high-resolution NMR measurements, for example, by applying a homogeneous magnetic field to the sample S. After correction of the magnetic field by the method of magnetic field correction associated with the present embodiment, the magnetic field strength applied to the sample S can be measured by measuring peak positions. The obtained signal can be used as a reference signal for NMR signals.

3. Modified Embodiments

Modified embodiments of the nuclear magnetic resonance spectrometer associated with the present embodiment are next described. Only differences with the above-described nuclear magnetic resonance spectrometer 100 are described; description of identical components is omitted.

(1) A first modified embodiment is first described.

In the above-described example of nuclear magnetic resonance spectrometer 100, the angle β (made between the Z-axis and the $Z^{tilt}$-axis) shown in FIG. 2 is the magic angle $\theta_m$. The angle β may also be π/2. That is, in this modified embodiment, the sample S in the sample tube 1 is spun about an axis tilted at or substantially at the angle of π/2 with respect to the static magnetic field and the resulting NMR signal is measured. For example, the axis tilted substantially at the angle π/2 with respect to the static magnetic field is an axis tilted at an angle in the range $(π/2)-5° \leq β \leq (π/2)+5°$.

In Eq. (5) above, with respect to the first-order magnetic field component $B_{Z(1)}^{tilt}$ of the corrective magnetic field along the $Z^{tilt}$-axis, the coefficients of $B_{Z(1)}$ and $B_{Z(3)}$ are null when β=π/2. Therefore, $B_{Z(1)}$ does not affect the magnetic field component $B_{Z(1)}^{tilt}$. Also, $B_{Z(3)}$ does not affect the magnetic field component $B_{Z(3)}^{tilt}$.

Therefore, when β=π/2, the arithmetic unit 34 can use at least one of $B_{1(1)}^e$ and $B_{1(1)}^o$ or the linear sum of these two as the magnetic field component $B_{Z(1)}^{tilt}$.

Furthermore, in Eq. (5) above, with respect to the second-order and third-order magnetic field components $B_{Z(2)}^{tilt}$ and $B_{Z(3)}^{tilt}$ of the corrective magnetic field along the $Z^{tilt}$-axis, all of their coefficients are nonzero when β=π/2.

Therefore, when β=π/2, the arithmetic unit 34 can use at least one of $B_{Z(2)}, B_{2(2)}^e, B_{2(2)}^o, B_{2(1)}^e$, and $B_{2(1)}^o$ or the linear sum of at least two of them as the second-order magnetic field component $B_{Z(2)}^{tilt}$ of the corrective magnetic field along the $Z^{tilt}$-axis.

In addition, when β=π/2, the arithmetic unit 34 can use at least one of $B_{3(1)}^e, B_{3(1)}^o, B_{3(2)}^e, B_{3(2)}^o, B_{3(3)}^e$, and $B_{3(3)}^o$ or the linear sum of at least two of them as the third-order magnetic field component $B_{Z(3)}^{tilt}$ of the corrective magnetic field along the $Z^{tilt}$-axis.

Thus, the static magnetic field applied to the sample S in the sample tube 1 spun about the axis tilted at the angle of π/2 with respect to the static magnetic field can be efficiently corrected in the same way as in the example of the nuclear magnetic resonance spectrometer 100.

(2) A second modified embodiment is next described.

In the above-described example of nuclear magnetic resonance spectrometer 100, the angle β (angle made between the Z-axis and the $Z^{tilt}$-axis) shown in FIG. 2 is the magic angle $\theta_m$. In contrast, in this modified embodiment, the angle β should satisfy the relationship, $5 \cos^2 β - 3 = 0$. That is, the angle β can be approximately 39°. The angle satisfying the relationship, $5 \cos^2 β - 3 = 0$, is herein referred to as the first angle $\theta_1$. In this modified embodiment, the sample S in the sample tube 1 is spun about an axis tilted strictly at the first angle $\theta_1 (β=\theta_1)$ with respect to the static magnetic field and the resulting NMR signal is measured. In addition, the sample S can be spun about an axis tilted substantially at the first angle $\theta_1$ with respect to the static magnetic field. That is, the axis is tilted at an angle, for example, lying in the range $\theta_1 - 5° \leq β \leq \theta_1 + 5°$.

In Eq. (5), when β=$\theta_1$, all of the first-order and second-order magnetic field components $B_{Z(2)}^{tilt}$ and $B_{Z(3)}^{tilt}$ of the corrective magnetic field along the $Z^{tilt}$-axis are nonzero coefficients. That is, none of these coefficients are null.

Accordingly, when β=$\theta_1$, the arithmetic unit 34 can use at least one of $B_{Z(1)}, B_{1(1)}^e$, and $B_{1(1)}^o$ or the linear sum of at least two of them as the first-order magnetic field component $B_{Z(1)}^{tilt}$ of the corrective magnetic field along the $Z^{tilt}$-axis.

Furthermore, when β=$\theta_1$, the arithmetic unit 34 can use at least one of $B_{Z(2)}, B_{2(2)}^e, B_{2(2)}^o, B_{2(1)}^e$, and $B_{2(1)}^o$ or the linear sum of at least two of them as the second-order magnetic field component $B_{Z(2)}^{tilt}$ of the corrective magnetic field along the $Z^{tilt}$-axis.

Additionally, in Eq. (5) above, when β=$\theta_1$, with respect to the third-order magnetic field component $B_{Z(3)}^{tilt}$ of the corrective magnetic field along the $Z^{tilt}$-axis, the coefficient of $B_{Z(3)}$ is null and, therefore, $B_{Z(3)}$ does not affect $B_{Z(3)}^{tilt}$.

Accordingly, the arithmetic unit 34 can use at least one of $B_{3(1)}^e, B_{3(1)}^o, B_{3(2)}^e, B_{3(2)}^o, B_{3(3)}^e$, and $B_{3(3)}^o$ or the linear sum of at least two of them as the third-order magnetic field component $B_{Z(3)}^{tilt}$ of the corrective magnetic field along the $Z^{tilt}$-axis.

Thus, the static magnetic field applied to the sample S in the sample tube 1 spun about an axis tilted at the first angle $\theta_1$ with respect to the static magnetic field can be efficiently corrected in the same way as in the example of the NMR spectrometer 100.

(3) A third modified embodiment is next described.

Where there are plural NMR signals, it is impossible to create a magnetic field map using a spin echo method or a gradient echo method. As such, a magnetic field map can be created, even if there are plural signals, by exciting only certain peaks instead of excitation of the first 90-degree pulse used in a spin echo method or gradient echo method.

(4) A fourth modified embodiment is next described.

In the example of the NMR spectrometer 100, the corrective magnetic field is applied such that the magnetic field along the $Z^{tilt}$-axis is homogenized. The invention is not limited to this method. The corrective magnetic field may be so applied that the magnetic field along the $Z^{tilt}$-axis obeys an arbitrary function. For example, the corrective magnetic field may be applied such that the magnetic field along the $Z^{tilt}$-axis varies linearly.

(5) A fifth modified embodiment is next described.

In the example of the NMR spectrometer 100, the first-order through third-order terms are used as the magnetic field components of the corrective magnetic field along the $Z^{tilt}$- axis. The fourth-order term and higher-order terms may also be added, in which case the magnetic field can be corrected more accurately.

4. Example

A corrective magnetic field was produced by the aforementioned nuclear magnetic resonance spectrometer 100. The results are shown below. The sample was spun when the axis of spinning of the sample ($Z^{tilt}$-axis) was tilted at the magic angle $\theta_m$ from the static magnetic field, and $^1$H NMR spectra were measured. It was assumed that the axis of spinning of the sample lay in the ZY-plane shown in FIG. 2. That is, in FIG. 2, the relationships $\beta=\theta_m$ and $\alpha=\pi/2$ hold. Under these conditions, a magnetic field map (distribution of the corrective magnetic field) created by the corrective magnetic field generating portion 20 (shim coil set 22) was measured.

First, the shim coil set 22 was energized with electrical current. A spin echo measurement was performed while applying $B_{Z(1)}$. $B_{Z(1)}(Z^{tilt})$ was plotted. $B_{Z(1)}$ is a term whose magnetic field varies linearly in going along the Z-axis. In the tilted coordinate system, this is given by $$B_{z(t)}^{tilt} = B_{z(1)}\cos\beta = \frac{B_{z(1)}}{\sqrt{3}}$$

Figure 8:
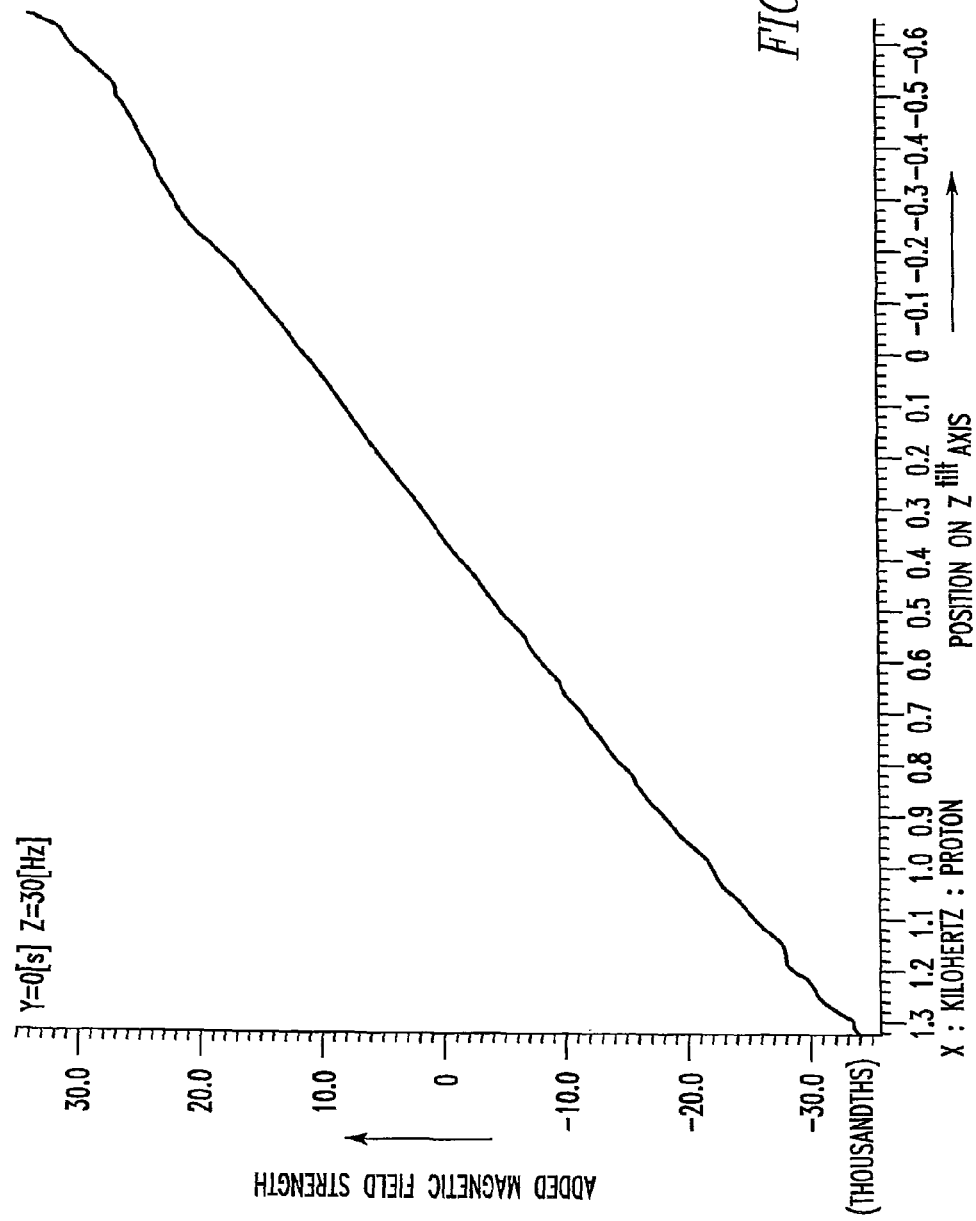
FIG. 8 is a graph showing the results of a measurement of the magnetic field distribution of $B_{Z(1)}(Z^{tilt})$ along the $Z^{tilt}$-axis.

That is, the applied magnetic field varies linearly also along the $Z^{tilt}$-axis. FIG. 8 is a graph showing the results of a measurement of a distribution of the magnetic field of $B_{Z(1)}$ ($Z^{tilt}$). As shown in FIG. 8, a linear magnetic field map was observed in $B_{Z(1)}(Z^{tilt})$.

The first-order magnetic field component $B_{Z(1)}{}^{tilt}$ of the corrective magnetic field along the $Z^{tilt}$-axis is next described. From Eq. (5) above, the first-order magnetic field component $B_{Z(1)}{}^{tilt}$ along the $Z^{tilt}$-axis in the tilted coordinate system is given by $$B_{Z(t)}^{tilt} = B_{Z(1)}\cos\beta + B_{1(1)}^e\sin\beta\cos\alpha + B_{1(1)}^o\sin\beta\sin\alpha$$

$$= \frac{B_{Z(1)}}{\sqrt{3}} + B_{1(1)}^e \cdot 0 + B_{1(1)}^o\sqrt{2/3}$$

Accordingly, it can be seen from the above equation that $B_{1(1)}{}^e$ does not affect $B_{Z(1)}{}^{tilt}$ (produces no effective magnetic field) and that $B_{1(1)}{}^o$ produces effects similar to those produced by $B_{Z(1)}$.

Figure 9:
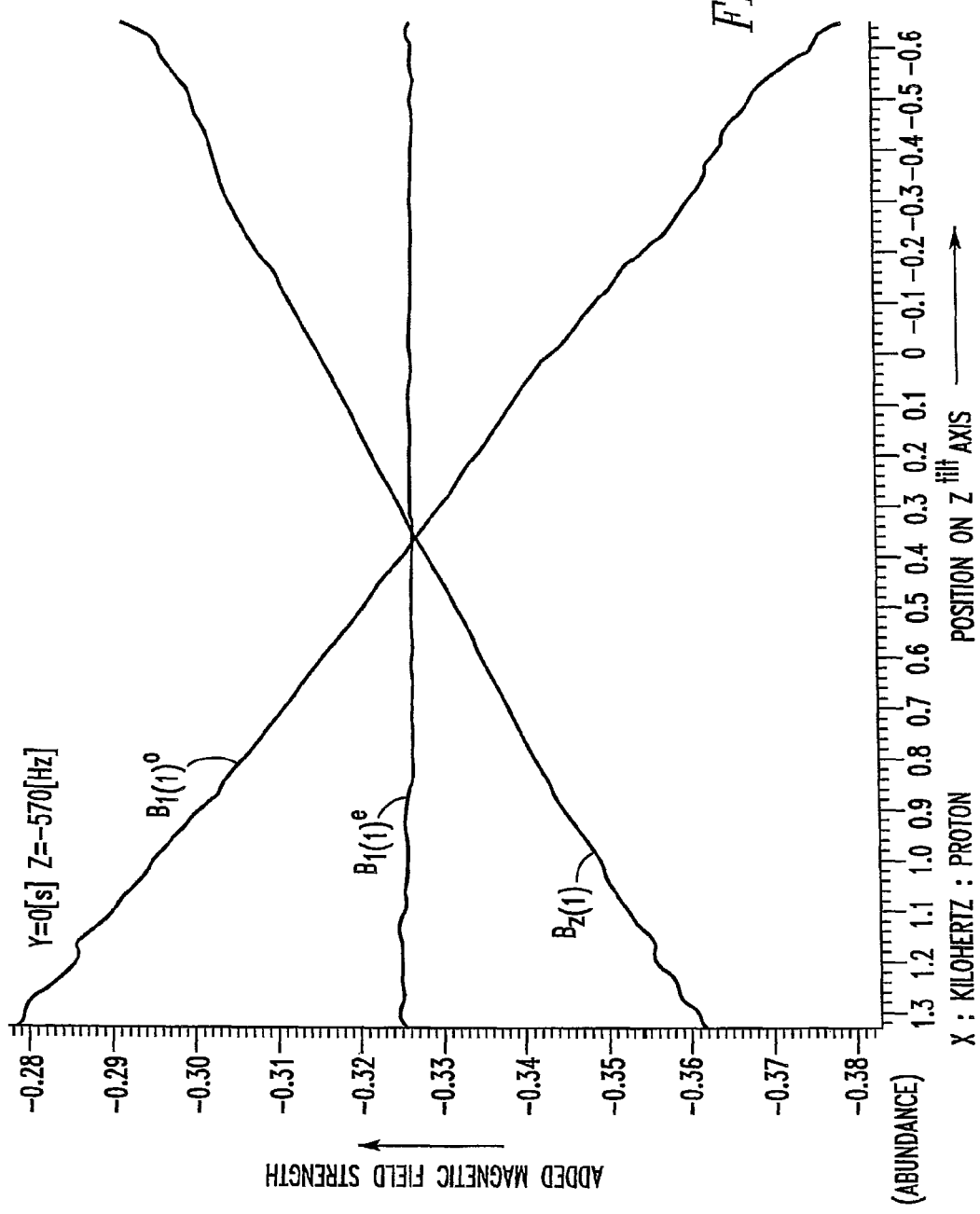
FIG. 9 is a graph showing the results of measurements of the magnetic field distributions of $B_{Z(1)}$, $B_{1(1)}{}^e$, and $B_{1(1)}{}^o$ along the $Z^{tilt}$-axis.

FIG. 9 is a graph showing the results of measurements of magnetic field distributions along the $Z^{tilt}$-axis about each of the field components $B_{Z(1)}$, $B_{1(1)}{}^e$, and $B_{1(1)}{}^o$. As shown in FIG. 9, the field component $B_{1(1)}{}^e$ varies less in intensity than the other magnetic field components $B_{Z(1)}$ and $B_{1(1)}{}^o$ along the $Z^{tilt}$-axis and produces less effects on $B_{Z(1)}{}^{tilt}$. This agrees with the results of the aforementioned calculations. It can be seen from the results shown in FIG. 9 that $B_{1(1)}{}^o$ gives the greatest tilt and produces a corrective magnetic field most efficiently. In this way, $B_{Z(1)}{}^{tilt}$ is represented as the linear sum of plural terms. However, the terms $B_{Z(1)}$, $B_{1(1)}{}^e$, and $B_{1(1)}{}^o$ are different in effect. Therefore, it is important to select appropriate terms in making an efficient magnetic field correction. In the case where $\beta=\theta_m$ and $\alpha=\pi/2$, an efficient magnetic field correction can be made by using $B_{Z(1)}$ and $B_{1(1)}{}^o$ as the first-order magnetic field component $B_{Z(1)}{}^{tilt}$ of the corrective magnetic field along the $Z^{tilt}$-axis.

The second-order magnetic field component $B_{Z(2)}{}^{tilt}$ of the corrective magnetic field along the $Z^{tilt}$-axis is next described. Using Eq. (5) above, the second-order magnetic field component $B_{Z(2)}{}^{tilt}$ is given by the following formula in the same way as the first-order magnetic field component $B_{Z(1)}{}^{tilt}$ $$B_{z(2)}^{tilt} = 2B_{z(2)}P_2(\cos\beta) + (B_{2(2)}^e\cos2\alpha + B_{2(2)}^o\sin2\alpha)\frac{1}{2}\sin^2\beta +$$
$$(B_{2(1)}^e\cos\alpha + B_{2(1)}^o\sin\alpha)2\sin\beta\cos\beta$$
$$= 2B_{Z(2)} \cdot 0 + (-B_{2(2)}^e + B_{2(2)}^o \cdot 0)\frac{1}{3} + (B_{2(1)}^e \cdot 0 + B_{2(1)}^o)2\frac{\sqrt{2}}{3}$$

As given by the above equation, $B_{Z(2)}{}^{tilt}$ is represented as the linear sum of five terms ($B_{Z(2)}$, $B_{2(2)}{}^e$, $B_{2(2)}{}^o$, $B_{2(1)}{}^e$, and $B_{2(1)}{}^o$). Among them, the three terms, $B_{Z(2)}$, $B_{2(2)}{}^o$, and $B_{2(1)}{}^e$, have zero coefficients and so do not affect $B_{Z(2)}{}^{tilt}$ (i.e., produce no effective magnetic field).

Figure 10:
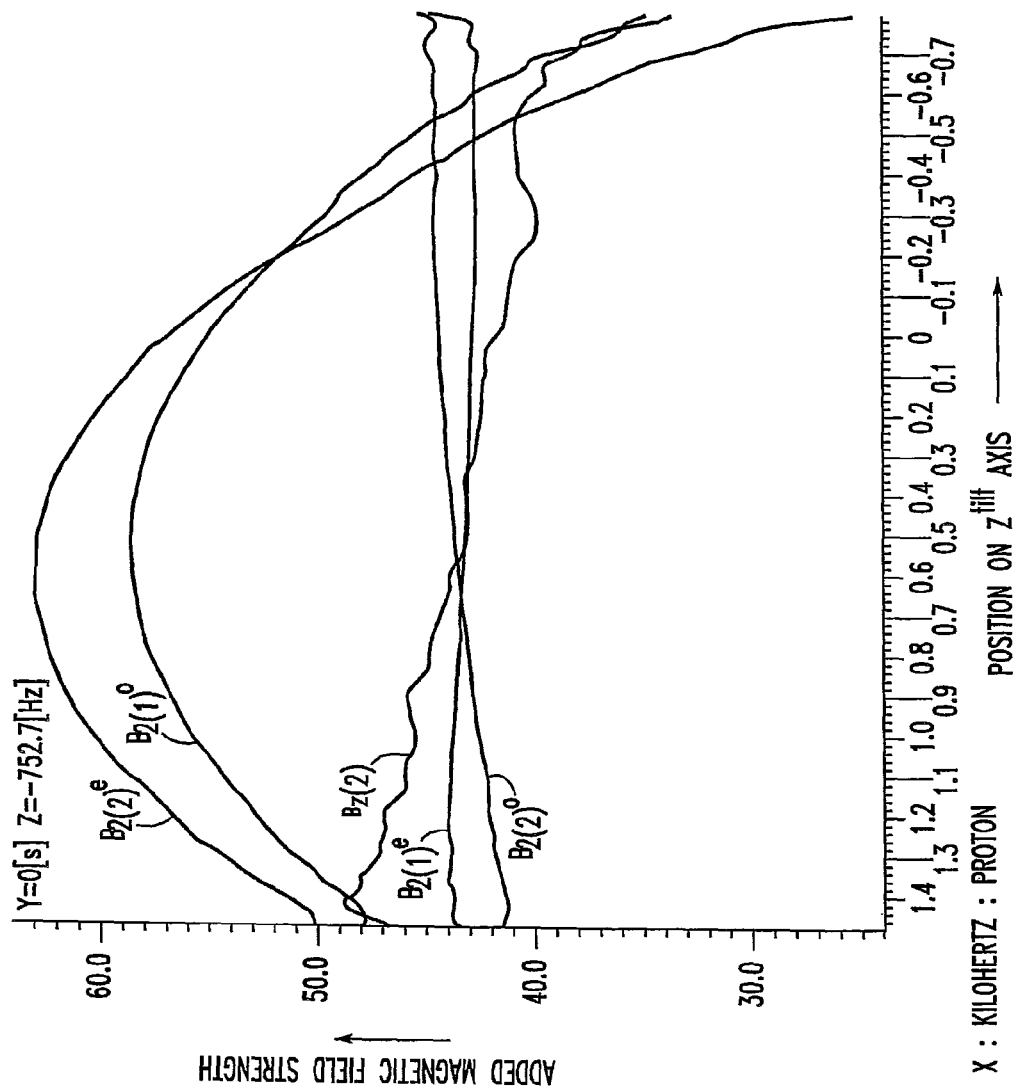
FIG. 10 is a graph showing the results of measurements of the magnetic field distributions of $B_{Z(2)}$, $B_{2(2)}{}^e$, $B_{2(2)}{}^o$, $B_{2(2)}{}^o$, $B_{2(1)}{}^e$, and $B_{2(1)}{}^o$ along the $Z^{tilt}$-axis.

FIG. 10 is a graph showing the results of measurements of magnetic field distributions along the $Z^{tilt}$-axis about each of $B_{Z(2)}$, $B_{2(2)}{}^e$, $B_{2(2)}{}^o$, $B_{2(1)}{}^e$, and $B_{2(1)}{}^o$.

As shown in FIG. 10, $B_{Z(2)}$, $B_{2(2)}{}^o$, and $B_{2(1)}{}^e$ vary less in intensity along the $Z^{tilt}$-axis than the other magnetic field components $B_{2(2)}{}^e$ and $B_{2(1)}{}^o$ and produce less effects on $B_{Z(2)}{}^{tilt}$. This agrees with the above-described results of calculations. Accordingly, when $\beta=\theta_m$ and $\alpha=\pi/2$, an efficient magnetic field correction can be achieved by using $B_{2(2)}{}^e$ and $B_{2(1)}{}^o$ as the second-order magnetic field component $B_{Z(2)}{}^{tilt}$ of the corrective magnetic field along the $Z^{tilt}$-axis.

The third-order magnetic field component $B_{Z(3)}{}^{tilt}$ of the corrective magnetic field along the $Z^{tilt}$-axis is next described. Using Eq. (5) above, the third-order magnetic field component $B_{Z(3)}{}^{tilt}$ is given by the following equation:

$$B_{z(3)}^{tilt} = B_{Z3}\cos\beta(5\cos^2\beta - 3) + (B_{3(1)}^e\cos\alpha + B_{3(1)}^o\sin\alpha)2\sin\beta$$
$$\left(1 - \frac{5}{4}\sin^2\beta\right) + \left(B_{3(2)}^e\cos2\alpha + \frac{1}{2}B_{3(2)}^o\sin2\alpha\right)\frac{1}{2}\sin^2\beta\cos\beta +$$
$$(B_{3(3}^e\cos3\alpha + B_{3(3)}^o\sin3\alpha)\frac{1}{12}\sin^3\beta$$
$$= -B_{z3}\frac{4}{3\sqrt{3}} + (B_{3(1)}^e \cdot 0 + B_{3(1)}^o)\frac{1}{3}\sqrt{\frac{2}{3}} +$$
$$\left(-B_{3(2)}^e + \frac{1}{2}B_{3(2)}^o \cdot 0\right)\frac{1}{3\sqrt{3}} +$$
$$(B_{3(3)}^e \cdot 0 - B_{3(3)}^o)\frac{1}{18}\sqrt{\frac{2}{3}}$$

$B_{Z(3)}{}^{tilt}$ is represented as the linear sum of seven terms, $B_{Z(3)}$, $B_{3(3)}{}^e$, $B_{3(3)}{}^o$, $B_{3(2)}{}^e$, $B_{3(2)}{}^o$, $B_{3(1)}{}^e$, and $B_{3(1)}{}^o$. Among them, three terms $B_{3(3)}{}^e$, $B_{3(2)}{}^o$, and $B_{3(1)}{}^e$ have zero coefficients and thus do not affect $B_{Z(3)}{}^{tilt}$ (i.e., produce no effective magnetic field). Accordingly, in the case where $\beta=\theta_m$ and $\alpha=\pi/2$, an efficient magnetic field correction can be made by using $B_{Z(3)}$, $B_{3(3)}{}^o$, $B_{3(2)}{}^e$, and $B_{3(1)}{}^o$ as the third-order magnetic field component $B_{Z(3)}{}^{tilt}$ of the corrective magnetic field along the $Z^{tilt}$-axis.

Figure 11A:
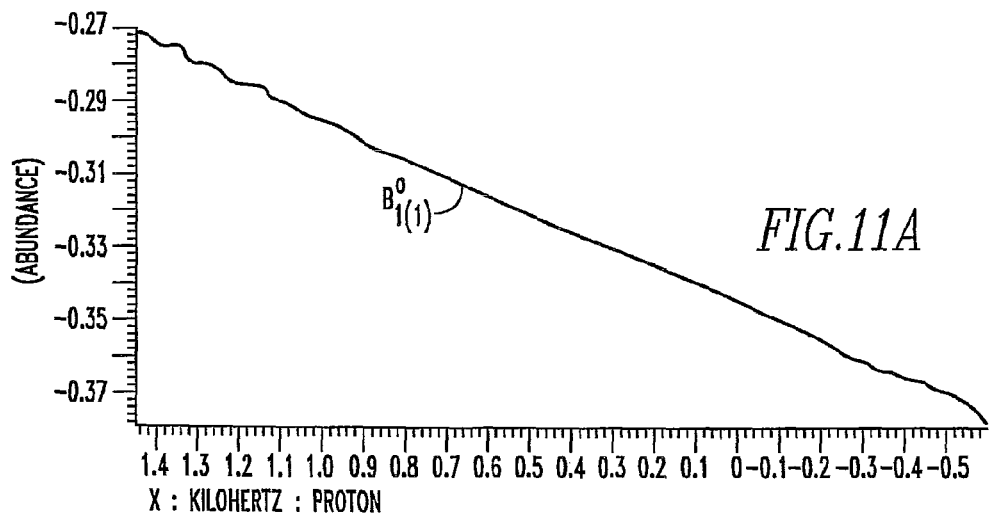
FIGS. 11A, 11B, and 11C are graphs showing the results of measurements of magnetic field distributions of $B_{1(1)}{}^o$, $B_{2(2)}{}^e$, and $B_{Z(3)}$ along the $Z^{tilt}$-axis.
Figure 11B:
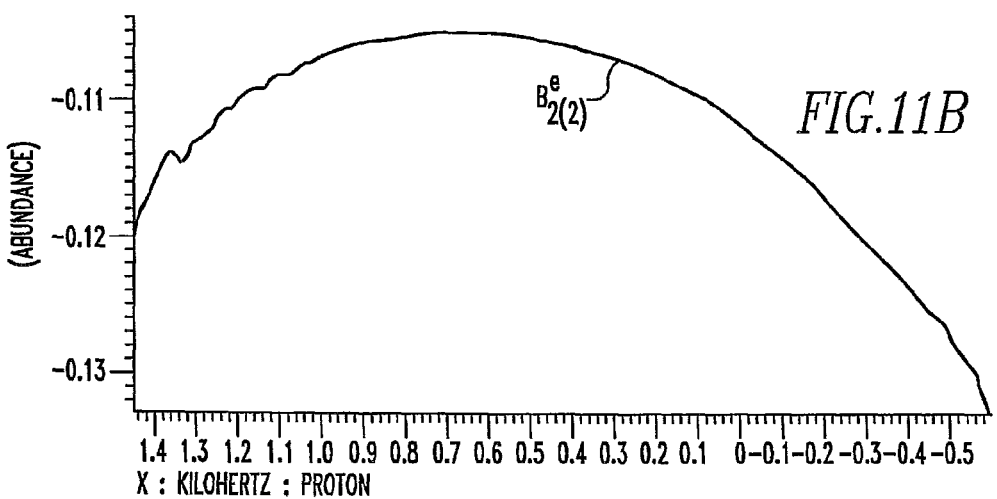
Figure 11C:
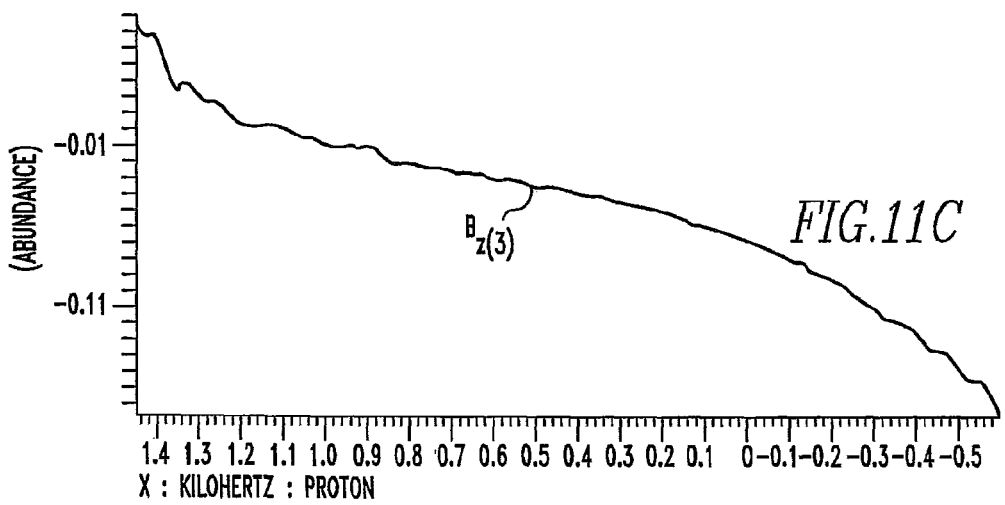

Then, the static magnetic field was corrected by using $B_{1(1)}{}^o$ as the first-order magnetic field component, $B_{2(2)}{}^e$ as the second-order magnetic field component, and $B_{Z(3)}$ as the third-order magnetic field component. FIGS. 11A, 11B, and 11C are graphs showing the results of measurements of the magnetic field distribution along the $Z^{tilt}$-axis about each of $B_{1(1)}{}^o$, $B_{2(2)}{}^e$, and $B_{Z(3)}$. Then, the magnetic field distribution of $B_{unshimmed}$ (r) was acquired. The magnetic field was corrected by taking an appropriate linear sum of these three terms.

Figure 12:
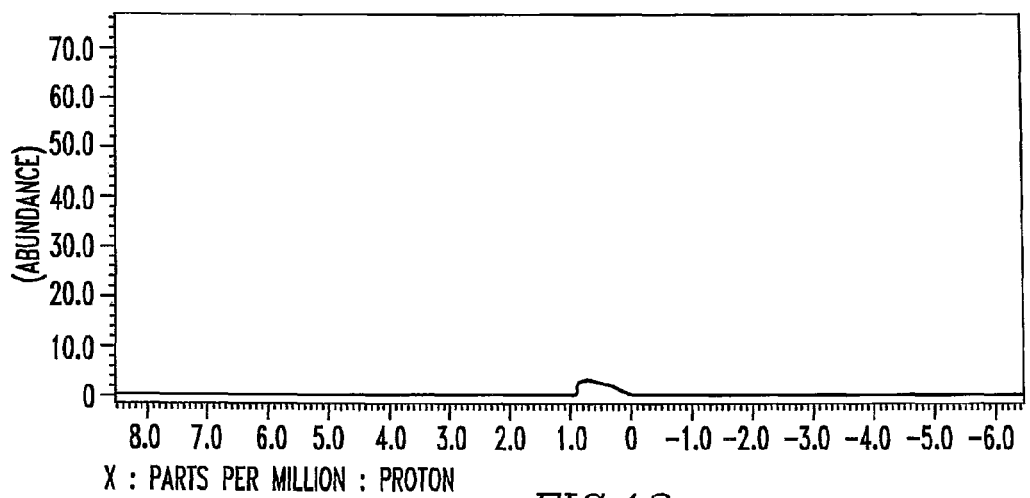
FIG. 12 is an NMR spectrum obtained prior to application of a corrective magnetic field.
Figure 13:
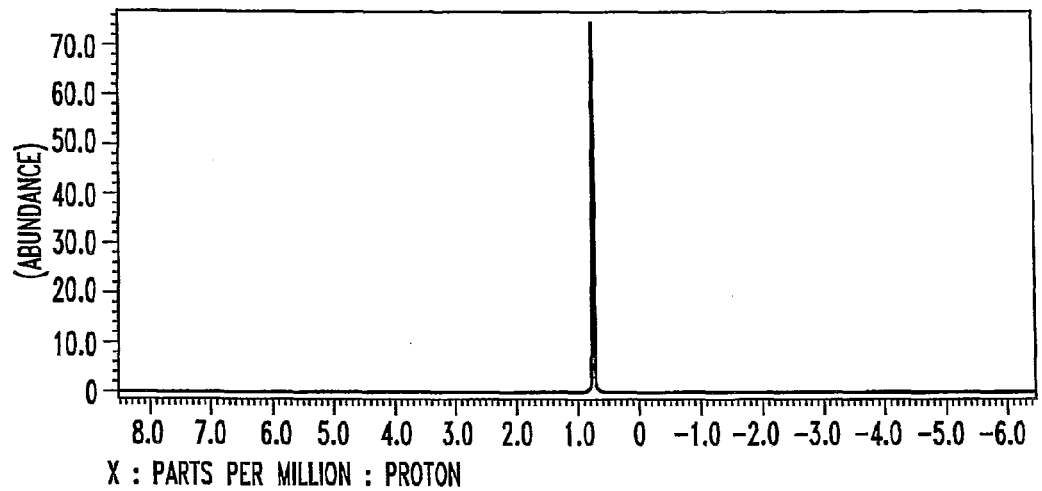
FIG. 13 is an NMR spectrum obtained under application of a corrective magnetic field.

FIG. 12 is an NMR spectrum obtained prior to application of a corrective magnetic field. FIG. 13 is an NMR spectrum obtained when a corrective magnetic field was applied by the method of the present embodiment. As shown in FIGS. 12 and 13, the lineshape of the NMR spectrum was improved greatly as a result of the application of the corrective magnetic field.

Shim terms are represented by various methods. FIG. 14 is a table showing the corresponding relationships between the shim terms represented by the method according to the present embodiment and shim terms represented by other methods. As shown in FIG. 14, the shim terms represented by the method according to the present embodiment can also be represented by other methods. For example, as shown in FIG. 14, $B_{1(1)}{}^e$ can also be represented as $B_{x1}$. The other shim terms set forth in the present embodiment can also be represented as shown in FIG. 14.

It is to be understood that the above embodiment and modified embodiments are merely exemplary of the invention and that the invention is not restricted thereto. For example, they may be appropriately combined.

The invention embraces configurations (e.g., configurations identical in function, method, and results or configurations identical in purpose and effects) substantially identical with the configurations described in the above embodiment. Furthermore, the invention embraces configurations having those non-essential portions of the configurations described in the embodiment which have been replaced by other portions. In addition, the invention embraces configurations yielding the same advantageous effects or configurations capable of achieving the same purpose as the configurations described in the embodiments. Further, the invention embraces configurations consisting of the configurations described in the above embodiment to which well-known techniques are attached.

Having thus described my invention with the detail and particularity required by the Patent Laws, what is desired protected by Letters Patent is set forth in the following claims.

The invention claimed is:

1. A nuclear magnetic resonance spectrometer for spinning a sample about an axis tilted at a magic angle with respect to a static magnetic field and detecting a nuclear magnetic resonance signal, said nuclear magnetic resonance spectrometer comprising:
a static magnetic field generating portion for producing the static magnetic field extending along a z-axis;
a corrective magnetic field generating portion for producing a corrective magnetic field to correct the static magnetic field, comprising a shim coil set with plural shim coils arranged around the z-axis;
a control portion for controlling the corrective magnetic field generating portion; and
a probe for detecting a nuclear magnetic resonance signal emanating from the sample;
wherein said control portion has a magnetic field distribution acquisition section for obtaining a distribution of the static magnetic field along said tilted axis by NMR measurements using the probe wherein the sample is spun about the tilted axis, an arithmetic unit for determining a first coefficient of a first-order magnetic field component of the corrective magnetic field, a second coefficient of a second-order magnetic field component of the corrective magnetic field, and a third coefficient of a third-order magnetic field component of the corrective magnetic field along the tilted axis based on the distribution of the static magnetic field, and a corrective magnetic field generating portion control section for controlling the corrective magnetic field generating portion based on the first, second, and third coefficients;
wherein said corrective magnetic field is given by the following Eqs. (1), (2), and (3):

$$B_{z(n)} \propto b_{z(n)} r^n P_n(\cos \theta) \qquad (1)$$

$$B_{m(n)}{}^e \propto b_{m(n)} r^n P_{nm_n}(\cos \theta)\cos m\phi \qquad (2)$$

$$B_{m(n)}{}^o \propto b_{m(n)} r^n P_{nm_n}(\cos \theta)\sin m\phi \qquad (3)$$

where
n is an integer equal to or greater than unity,
m is an integer satisfying the relationship $|m| \leq n$,
z is an axis extending along the static magnetic field,
$b_{m(n)}$ are said first, second, and third coefficients,
$r, \theta, \phi$ are coordinate-axis components of polar coordinates, and
$P_{nm_n}(\cos \theta)$ are associated Legendre functions; and
wherein said arithmetic unit uses at least one of $B_{Z(1)}$, $B_{1(1)}{}^e$, and $B_{1(1)}{}^o$ or a linear sum of at least two of them as the first-order magnetic field component of the corrective magnetic field, uses at least one of $B_{2(2)}{}^e$, $B_{2(2)}{}^o$, $B_{2(1)}{}^e$, and $B_{2(1)}{}^o$ or a linear sum of at least two of them as the second-order magnetic field component of the corrective magnetic field, and uses at least one of $B_{Z(3)}$, $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or a linear sum of at least two of them as the third-order magnetic field component of the corrective magnetic field.

2. The nuclear magnetic resonance spectrometer of claim 1, wherein said magnetic field distribution acquisition section obtains the distribution of the static magnetic field along said tilted axis by a spin echo method or a gradient echo method.

3. The nuclear magnetic resonance spectrometer of any one of claims 1 and 2,
wherein said corrective magnetic field generating portion has a power supply unit for supplying electrical currents to the shim coils,
wherein said corrective magnetic field generating portion control section determines amounts of currents supplied to the shim coils based on said first, second, and third coefficients determined by said arithmetic unit, and
wherein said power supply unit supplies currents, which correspond to the amounts of currents determined by the corrective magnetic field generating portion, to the coils.

4. In a nuclear magnetic resonance measurement in which a sample is arranged in a static magnetic field extending along a z-axis and spun about an axis tilted at a magic angle with respect to the z-axis and a nuclear magnetic resonance signal from the sample is detected, a method of correcting the static magnetic field along the tilted axis by producing a corrective magnetic field generated by a shim coil set with plural shim coils arranged around the z-axis, comprising the steps of:
acquiring a distribution of the static magnetic field along said tilted axis by NMR measurements using the probe wherein the sample is spun about the tilted axis;
computationally determining a first coefficient of a first-order magnetic field component of the corrective magnetic field, a second coefficient of a second-order magnetic field component of the corrective magnetic field, and a third coefficient of a third-order magnetic field component of the corrective magnetic field along the tilted axis based on the acquired distribution of the static magnetic field; and
controlling the corrective magnetic field based on the first, second, and third coefficients;

wherein said corrective magnetic field is given by the following Eqs. (1), (2), and (3):

$$B_{z(n)} \propto b_{z(n)} r^n P_n(\cos \theta) \quad (1)$$

$$B_{m(n)}{}^e \propto b_{m(n)} r^n P_{nm_n}(\cos \theta) \cos m\phi \quad (2)$$

$$B_{m(n)}{}^o \propto b_{m(n)} r^n P_{nm_n}(\cos \theta) \sin m\phi \quad (3)$$

where
n is an integer equal to or greater than unity,
m is an integer satisfying the relationship $|m| \leq n$,
z is an axis extending along the static magnetic field,
$b_{m(n)}$ are said first, second, and third coefficients,
r, $\theta$, $\phi$ are coordinate-axis components of polar coordinates, and
$P_{nm_n}(\cos \theta)$ are associated Legendre functions; and
wherein during said step of computationally determining the coefficients, at least one of $B_{Z(1)}$, $B_{1(1)}{}^e$, and $B_{1(1)}{}^o$ or a linear sum of at least two of them is used as the first-order magnetic field component of the corrective magnetic field, at least one of $B_{2(2)}{}^e$, $B_{2(2)}{}^o$, $B_{2(1)}{}^e$, and $B_{2(1)}{}^o$ or a linear sum of at least two of them is used as the second-order magnetic field component of the corrective magnetic field, and at least one of $B_{Z(3)}$, $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or a linear sum of at least two of them is used as the third-order magnetic field component of the corrective magnetic field.

5. A method of correcting a static magnetic field as set forth in claim 4, wherein during said step of acquiring the distribution of the static magnetic field, the distribution of the static magnetic field along said tilted axis is acquired by a spin echo method or a gradient echo method.

6. A nuclear magnetic resonance spectrometer for spinning a sample about an axis tilted at an angle of $\pi/2$ with respect to a static magnetic field and detecting a nuclear magnetic resonance signal, said nuclear magnetic resonance spectrometer comprising:
a static magnetic field generating portion for producing the static magnetic field extending along a z-axis;
a corrective magnetic field generating portion for producing a corrective magnetic field to correct the static magnetic field, comprising a shim coil set with plural shim coils arranged around the z-axis;
a control portion for controlling the corrective magnetic field generating portion; and
a probe for detecting the nuclear magnetic resonance signal emanating from the sample;
wherein said control portion has a magnetic field distribution acquisition section for obtaining a distribution of the static magnetic field along said tilted axis by NMR measurements using the probe wherein the sample is spun about the tilted axis, an arithmetic unit for determining a first coefficient of a first-order magnetic field component of the corrective magnetic field, a second coefficient of a second-order magnetic field component of the corrective magnetic field, and a third coefficient of a third-order magnetic field component of the corrective magnetic field based on the distribution of the static magnetic field along the tilted axis, and a corrective magnetic field generating portion control section for controlling the corrective magnetic field generating portion based on the first, second, and third coefficients;
wherein said corrective magnetic field is given by the following Eqs. (1), (2), and (3):

$$B_{z(n)} \propto b_{z(n)} r^n P_n(\cos \theta) \quad (1)$$

$$B_{m(n)}{}^e \propto b_{m(n)} r^n P_{nm_n}(\cos \theta) \cos m\phi \quad (2)$$

$$B_{m(n)}{}^o \propto b_{m(n)} r^n P_{nm_n}(\cos \theta) \sin m\phi \quad (3)$$

where
n is an integer equal to or greater than unity,
m is an integer satisfying the relationship $|m| \leq n$,
z is an axis extending along the static magnetic field,
$b_{m(n)}$ are said first, second, and third coefficients,
r, $\theta$, $\phi$ are coordinate-axis components of polar coordinates, and
$P_{nm_n}(\cos \theta)$ are associated Legendre functions; and
wherein said arithmetic unit uses at least one of $B_{1(1)}{}^e$ and $B_{1(1)}{}^o$ or a linear sum of these two as the first-order magnetic field component of the corrective magnetic field, uses at least one of $B_{Z(2)}$, $B_{2(2)}{}^e$, $B_{2(2)}{}^o$, $B_{2(1)}{}^e$, and $B_{2(1)}{}^o$ or a linear sum of at least two of them as the second-order magnetic field component of the corrective magnetic field, and uses at least one of $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or a linear sum of at least two of them as the third-order magnetic field component of the corrective magnetic field.

7. In a nuclear magnetic resonance measurement in which a sample is arranged in a static magnetic field extending along a z-axis and spun about an axis tilted at an angle of $\pi/2$ with respect to the z-axis and a nuclear magnetic resonance signal from the sample is detected, a method of correcting distribution of the static magnetic field along the tilted axis by producing a corrective magnetic field generated by a shim coil set with plural shim coils arranged around the z-axis, said method comprising the steps of:
acquiring a distribution of the static magnetic field along said tilted axis by NMR measurements using the probe wherein the sample is spun about the tilted axis;
computationally determining a first coefficient of a first-order magnetic field component of the corrective magnetic field, a second coefficient of a second-order magnetic field component of the corrective magnetic field, and a third coefficient of a third-order magnetic field component of the corrective magnetic field based on the acquired distribution of the static magnetic field along the tilted axis; and
controlling the corrective magnetic field based on the first, second, and third coefficients;
wherein said corrective magnetic field is given by the following Eqs. (p1), (2), and (3):

$$B_{z(n)} \propto b_{z(n)} r^n P_n(\cos \theta) \quad (1)$$

$$B_{m(n)}{}^e \propto b_{m(n)} r^n P_{nm_n}(\cos \theta) \cos m\phi \quad (2)$$

$$B_{m(n)}{}^o \propto b_{m(n)} r^n P_{nm_n}(\cos \theta) \sin m\phi \quad (3)$$

where
n is an integer equal to or greater than unity,
m is an integer satisfying the relationship $|m| \leq n$,
z is an axis extending along the static magnetic field,
$b_{m(n)}$ are said first, second, and third coefficients,
r, $\theta$, $\phi$ are coordinate-axis components of polar coordinates, and
$P_{nm_n}(\cos \theta)$ are associated Legendre functions; and
wherein during said step of computationally determining the coefficients, at least one of $B_{1(1)}{}^e$ and $B_{1(1)}{}^o$ or a linear sum of these two is used as the first-order magnetic field component of the corrective magnetic field, at least one of $B_{Z(2)}$, $B_{2(2)}{}^e$, $B_{2(2)}{}^o$, $B_{2(1)}{}^e$, and $B_{2(1)}{}^o$ or a linear sum of at least two of them is used as the second-order magnetic field component of the corrective magnetic field, and at least one of $B_{3(1)}{}^e$, $B_{3(1)}{}^o$, $B_{3(2)}{}^e$, $B_{3(2)}{}^o$, $B_{3(3)}{}^e$, and $B_{3(3)}{}^o$ or a linear sum of at least two of them is used as the third-order magnetic field component of the corrective magnetic field.

8. A nuclear magnetic resonance spectrometer for spinning a sample about an axis tilted at a first angle with respect to a static magnetic field and detecting a nuclear magnetic resonance signal, said nuclear magnetic resonance spectrometer comprising:
a static magnetic field generating portion for producing the static magnetic field extending along a z-axis;
a corrective magnetic field generating portion for producing a corrective magnetic field to correct the static magnetic field, comprising a shim coil set with plural shim coils arranged around the z-axis;
a control portion for controlling the corrective magnetic field generating portion; and
a probe for detecting the nuclear magnetic resonance signal emanating from the sample;
wherein said control portion has a magnetic field distribution acquisition section for obtaining a distribution of the static magnetic field along said tilted axis by NMR measurements using the probe wherein the sample is spun about the tilted axis, an arithmetic unit for computationally determining a first coefficient of a first-order magnetic field component of the corrective magnetic field, a second coefficient of a second-order magnetic field component of the corrective magnetic field, and a third coefficient of a third-order magnetic field component of the corrective magnetic field based on the distribution of the static magnetic field along the tilted axis, and a corrective magnetic field generating portion control section for controlling the corrective magnetic field generating portion based on the first, second, and third coefficients;
wherein said first angle, $\beta$, satisfies the relationship, $5\cos^2\beta - 3 = 0$;
wherein said corrective magnetic field is given by the following Eqs. (1), (2), and (3):

$$B_{z(n)} \propto b_{z(n)} r^n P_n(\cos\theta) \quad (1)$$

$$B_{m(n)}^{e} \propto b_{m(n)} r^n P_{nm_n}(\cos\theta)\cos m\phi \quad (2)$$

$$B_{m(n)}^{o} \propto b_{m(n)} r^n P_{nm_n}(\cos\theta)\sin m\phi \quad (3)$$

where
n is an integer equal to or greater than unity,
m is an integer satisfying the relationship $|m| \leq n$,
z is an axis extending along the static magnetic field,
$b_{m(n)}$ are said first, second, and third coefficients,
$r, \theta, \phi$ are coordinate-axis components of polar coordinates, and
$P_{nm_n}(\cos\theta)$ are associated Legendre functions;
wherein said arithmetic unit uses at least one of $B_{Z(1)}$, $B_{1(1)}^{e}$, and $B_{1(1)}^{o}$ or a linear sum of at least two of them as the first-order magnetic field component of the corrective magnetic field, uses at least one of $B_{Z(2)}$, $B_{2(2)}^{e}$, $B_{2(2)}^{o}$, $B_{2(1)}^{o}$, and $B_{2(1)}^{o}$ or a linear sum of at least two of them as the second-order magnetic field component of the corrective magnetic field, and uses at least one of $B_{3(1)}^{e}$, $B_{3(1)}^{o}$, $B_{3(2)}^{e}$, $B_{3(2)}^{o}$, $B_{3(3)}^{e}$, and $B_{3(3)}^{o}$ or a linear sum of at least two of them as the third-order magnetic field component of the corrective magnetic field.

9. In a nuclear magnetic resonance measurement in which a sample is arranged in a static magnetic field extending along a z-axis and spun about an axis titled at a first angle with respect to the z-axis and a nuclear magnetic resonance signal from the sample is detected, a method of correcting distribution of the static magnetic field along the tilted axis by producing a corrective magnetic field generated by a shim coil set with plural shim coils arranged around the z-axis, comprising the steps of:
acquiring a distribution of the static magnetic field along said tilted axis by NMR measurements using the probe wherein the sample is spun about the tilted axis;
computationally determining a first coefficient of a first-order magnetic field component of the corrective magnetic field, a second coefficient of a second-order magnetic field component of the corrective magnetic field, and a third coefficient of a third-order magnetic field component of the corrective magnetic field based on the acquired distribution of the static magnetic field along the tilted axis; and
controlling the corrective magnetic field based on the first, second, and third coefficients;
wherein said first angle, $\beta$, satisfies the relationship, $5\cos^2\beta - 3 = 0$;
wherein said corrective magnetic field is given by the following Eqs. (1), (2), and (3):

$$B_{z(n)} \propto b_{z(n)} r^n P_n(\cos\theta) \quad (1)$$

$$B_{m(n)}^{e} \propto b_{m(n)} r^n P_{nm_n}(\cos\theta)\cos m\phi \quad (2)$$

$$B_{m(n)}^{o} \propto b_{m(n)} r^n P_{nm_n}(\cos\theta)\sin m\phi \quad (3)$$

where
n is an integer equal to or greater than unity,
m is an integer satisfying the relationship $|m| \leq n$,
z is an axis extending along the static magnetic field,
$b_{m(n)}$ are said first, second, and third coefficients,
$r, \theta, \phi$ are coordinate-axis components of polar coordinates, and
$P_{nm_n}(\cos\theta)$ are associated Legendre functions;
wherein during said step of computationally determining the coefficients, at least one of $B_{Z(1)}$, $B_{1(1)}^{e}$, and $B_{1(1)}^{o}$ or a linear sum of at least two of them is used as the first-order magnetic field component of the corrective magnetic field, at least one of $B_{Z(2)}$, $B_{2(2)}^{e}$, $B_{2(2)}^{o}$, $B_{2(1)}^{e}$, and $B_{2(1)}^{o}$ or a linear sum of at least two of them is used as the second-order magnetic field component of the corrective magnetic field, and at least one of $B_{3(1)}^{e}$, $B_{3(1)}^{o}$, $B_{3(2)}^{e}$, $B_{3(2)}^{o}$, $B_{3(3)}^{e}$, and $B_{3(3)}^{o}$ or a linear sum of at least two of them is used as the third-order magnetic field component of the corrective magnetic field.

10. The nuclear magnetic resonance spectrometer according to claim 1, wherein said magnetic field distribution acquisition section obtains the distribution of the static magnetic field along said tilted axis by NMR measurements using a pulse sequence with a gradient magnetic field pulse which is applied in the direction of the z-axis of the static magnetic field.

* * * * *